United States Patent
Suzuki et al.

(10) Patent No.: US 8,587,193 B2
(45) Date of Patent: Nov. 19, 2013

(54) LIGHT-EMITTING ELEMENT, LIGHT-EMITTING DEVICE AND ELECTRONIC DEVICE

(71) Applicant: Semiconductor Energy Laboratory Co., Ltd., Kanagawa-ken (JP)

(72) Inventors: Tsunenori Suzuki, Kanagawa (JP); Satoshi Seo, Kanagawa (JP); Ryoji Nomura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/680,228

(22) Filed: Nov. 19, 2012

(65) Prior Publication Data

US 2013/0069037 A1    Mar. 21, 2013

Related U.S. Application Data

(63) Continuation of application No. 13/025,578, filed on Feb. 11, 2011, now Pat. No. 8,314,548, and a continuation of application No. 11/821,757, filed on Jun. 25, 2007, now Pat. No. 7,902,742.

(30) Foreign Application Priority Data

Jul. 4, 2006 (JP) .................... 2006-184350
Dec. 4, 2006 (JP) .................... 2006-327609

(51) Int. Cl.
    *H05B 33/00* (2006.01)
(52) U.S. Cl.
    USPC .......................................... 313/504; 313/506
(58) Field of Classification Search
    USPC ..................... 313/498–512; 428/690
    See application file for complete search history.

(56) References Cited

U.S. PATENT DOCUMENTS

| | | | |
|---|---|---|---|
| 5,601,903 | A | 2/1997 | Fujii et al. |
| 7,196,360 | B2 | 3/2007 | Seo et al. |
| 7,456,425 | B2 | 11/2008 | Seo et al. |
| 7,474,049 | B2 | 1/2009 | Liu et al. |
| 8,080,934 | B2 | 12/2011 | Kido et al. |

(Continued)

FOREIGN PATENT DOCUMENTS

| | | |
|---|---|---|
| CN | 1370034 A | 9/2002 |
| CN | 1744786 | 3/2006 |

(Continued)

OTHER PUBLICATIONS

Tsutsui, T. et al., "High Quantum Efficiency in Organic Light-Emitting Devices with Iridium-Complex as a Triplet Emissive Center", Jpn. J. Appl. Phys., vol. 38, Part 2, No. 12B, Dec. 15, 1999, pp. L1502-L1504.

(Continued)

*Primary Examiner* — Joseph L Williams
(74) *Attorney, Agent, or Firm* — Husch Blackwell LLP

(57) ABSTRACT

The light-emitting element of the present invention includes a light-emitting layer and a layer for controlling movement of carriers between a pair of electrodes. The layer for controlling movement of carriers includes a first organic compound having a carrier transporting property and a second organic compound for reducing the carrier transporting property of the first organic compound, and the second organic compound is dispersed in the first organic compound. The layer for controlling movement of carriers is provided in such a manner, whereby change in carrier balance with time can be suppressed. Therefore, a light-emitting element having a long lifetime can be obtained.

54 Claims, 28 Drawing Sheets

(56) References Cited

U.S. PATENT DOCUMENTS

| | | |
|---|---|---|
| 8,482,193 B2 | 7/2013 | Kido et al. |
| 8,513,648 B2 | 8/2013 | Seo et al. |
| 2003/0189401 A1 | 10/2003 | Kido et al. |
| 2005/0100760 A1 | 5/2005 | Yokoyama |
| 2006/0043859 A1 | 3/2006 | Fukuoka et al. |
| 2006/0158102 A1 | 7/2006 | Kawamura et al. |
| 2006/0289882 A1 | 12/2006 | Nishimura et al. |
| 2007/0172699 A1 | 7/2007 | Nakashima et al. |
| 2008/0006821 A1 | 1/2008 | Suzuki et al. |
| 2008/0007164 A1 | 1/2008 | Suzuki et al. |
| 2008/0142794 A1 | 6/2008 | Shitagaki et al. |
| 2009/0072725 A1 | 3/2009 | Suzuki et al. |
| 2009/0079326 A1 | 3/2009 | Seo et al. |
| 2009/0079337 A1 | 3/2009 | Seo et al. |
| 2009/0102368 A1 | 4/2009 | Shitagaki et al. |
| 2009/0167168 A1 | 7/2009 | Seo et al. |
| 2009/0200918 A1 | 8/2009 | Seo et al. |
| 2009/0206331 A1 | 8/2009 | Seo et al. |
| 2009/0283757 A1 | 11/2009 | Seo et al. |
| 2010/0078631 A1 | 4/2010 | Pieh |
| 2010/0213457 A1 | 8/2010 | Shitagaki et al. |

FOREIGN PATENT DOCUMENTS

| | | |
|---|---|---|
| EP | 1 351 558 A1 | 10/2003 |
| EP | 1 565 041 A1 | 8/2005 |
| JP | 7-65958 | 3/1995 |
| JP | 2000-68057 | 3/2000 |
| JP | 2002-313584 | 10/2002 |
| JP | 2003-272860 | 9/2003 |
| JP | 2004-79413 | 3/2004 |
| JP | 2004-221045 | 8/2004 |
| JP | 2004-273163 | 9/2004 |
| JP | 2006-156888 | 6/2006 |
| WO | WO 2004/047499 A1 | 6/2004 |
| WO | WO 2006/059512 A1 | 6/2006 |
| WO | WO 2006/059736 A1 | 6/2006 |

OTHER PUBLICATIONS

Goldsmith, C.R. et al., "C-H Bond Activation by a Ferric Methoxide Complex: Modeling the Rate-Determining Step in the Mechanism of Lipoxygenase", J. Am. Chem Soc., vol. 124, No. 1, 2002, pp. 83-96.

Onishi.T et al, *High Molecular EL Materials—Development of Light-Emitting High Molecular Compunds*, "A Method of Measuring an Energy Level," Kyoritsu Shuppan, Dec. 25, 2004, pp. 64-67 (with English translation, pp. 64-67 (with English translation, pp. 1-3).

Cina, S. et al., "P-135: Efficient Electron Injection from PEDOT-PSS into a Graded-n-Doped Electron Transporting Layer in an Inverted OLED Structure," SID 05 Digest: SID International Symposium Digest of Technical Papers, vol. 36, 2005, pp. 819-821.

Lee, M.-T. et al, "Improved Stability of Organic Electroluminescent Devices by Doping Styrylamines in Hole or Electron Transporting Layer," Applied Physics Letters, vol. 86, No. 10, 2005, pp. 103501-1-103501-3.

Lee, M.-T. et al., "Highly Efficient, Deep-Blue Doped Organic Light-Emitting Devices," Advanced Materials, vol. 17, 2005, pp. 2493-2497.

European Search Report re application No. EP 07012956.4, dated Oct. 5, 2007.

Office Action re Chinese application No. CN 200710127179.7, dated Nov. 27, 2009 (with English translation).

Ho, C.-L. et al., "A Multifunctional Iridium-Carbazolyl Orange Phosphor for High-Performance Two-Element Woled Exploiting Exciton-Managed Fluorescence/Phosphorescence," Advanced Functional Materials, vol. 18, 2008, pp. 928-937.

Office Action re European Application No. EP 10010088.2, dated Aug. 2, 2012.

Office Action re Chinese application No. CN 201110026329.1, dated Jan. 17, 2013 (with English translation).

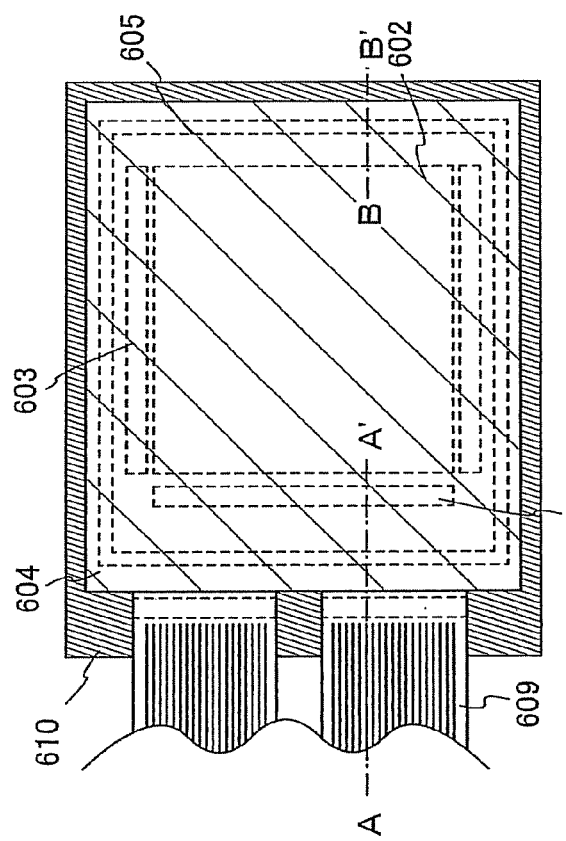
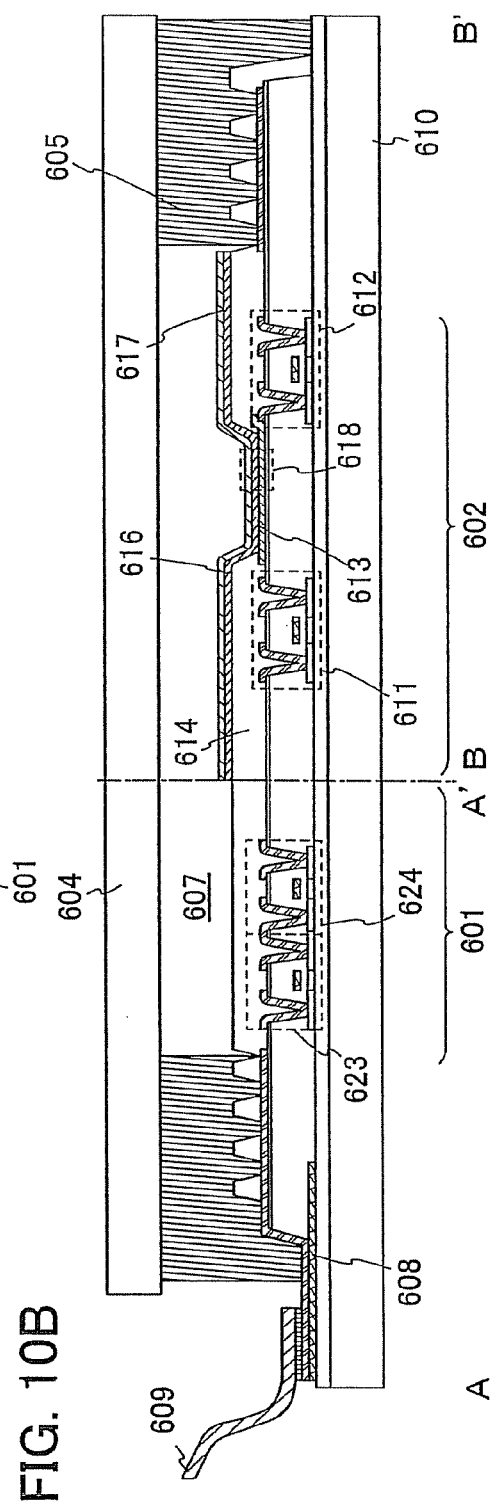
FIG. 10A
FIG. 10B

LIGHT-EMITTING ELEMENT, LIGHT-EMITTING DEVICE AND ELECTRONIC DEVICE

This application is a continuation of copending application Ser. No. 13/025,578 filed on Feb. 11, 2011 which is a continuation of application Ser. No. 11/821,757 filed on Jun. 25, 2007 (now U.S. Pat. No. 7,902,742 issued Mar. 8, 2011).

BACKGROUND OF THE INVENTION

1. Field of the Invention

The present invention relates to light-emitting elements of a current excitation type. The present invention also relates to light-emitting devices and electronic devices each of which has the light-emitting device. More specifically, the invention relates to light-emitting elements of a current excitation type having a long lifetime. Further, the invention relates to light-emitting devices and electronic devices each of which uses the light-emitting device.

2. Description of the Related Art

In recent years, research and development have been extensively conducted on light-emitting elements using electroluminescence. As a basic structure of these light-emitting elements, a structure where a substance having light-emitting property is interposed between a pair of electrodes is used. By application of a voltage to this element, light emission from a substance having light-emitting property can be obtained.

Since such a light-emitting element is a self-luminous type, there are advantages such as higher visibility of a pixel than visibility of a liquid crystal display, and unnecessity of a backlight. Accordingly, such a light-emitting element is considered to be suitable as a flat panel display element. In addition, such a light-emitting element can be manufactured to be thin and light, which is a great advantage. Moreover, the light-emitting element has a feature that response speed is extremely fast.

Furthermore, since such a light-emitting element can be formed into a film form, planar light emission can be easily obtained by formation of a large-area element. This characteristic is difficult to be obtained by a point light source typified by an incandescent lamp or an LED, or a line light source typified by a fluorescent lamp. Therefore, the light-emitting element has a high utility value as a plane light source that can be applied to lighting or the like.

The light-emitting elements using electroluminescence are classified roughly in accordance with whether they use an organic compound or an inorganic compound as a substance having light-emitting property. In the present invention, a substance having light-emitting property is an organic compound.

In a case where the substance having light-emitting property is an organic compound, by application of voltage to the light-emitting element, electrons and holes are injected from the pair of electrodes into the layer including an organic compound having light-emitting property to cause current flow. Then, by recombination of these carriers (electrons and holes), the organic compound having light-emitting property gets in an excited state, and light is emitted when the excited state returns to a ground state.

Because of such a mechanism, this kind of light-emitting element is referred to as a light-emitting element of a current excitation type. It is to be noted that an excited state formed by an organic compound can be a singlet excited state or a triplet excited state. Light emission from the singlet excited state is referred to as fluorescence, and light emission from the triplet excited state is referred to as phosphorescence.

In order to overcome many problems derived from materials of such a light-emitting element and to improve its element characteristics, improvement in an element structure, material development, and so on are carried out.

For example, in Non-Patent Document 1, a hole blocking layer is provided so that a light-emitting element using a phosphorescent material efficiently emits light.

NON-PATENT DOCUMENT

Tetsuo TSUTSUI et al., Japanese Journal of Applied Physics, vol. 38, L1502-L1504 (1999)

SUMMARY OF THE INVENTION

However, as disclosed in the Non-Patent Document, the hole blocking layer has poor durability, and the light emitting element has a short lifetime. Therefore, the light emitting element is desired to have a long lifetime. In view of the foregoing problem, it is an object of the present invention to provide a light-emitting element having a long lifetime. Further, it is another object of the present invention to provide a light-emitting device and an electronic device each having a long lifetime.

As a result of diligent study, the present inventors have found that when a layer for controlling movement of carriers is provided, change with time of carrier balance can be suppressed. Thus, the present inventors have also found that a light-emitting element having long lifetime can be obtained.

Therefore, one aspect of the present invention is a light-emitting element including a light-emitting layer and a layer for controlling movement of carriers between a pair of electrodes, where the layer for controlling movement of carriers includes a first organic compound having a carrier transporting property and a second organic compound for reducing the carrier transporting property of the first organic compound, and the second organic compound is dispersed in the first organic compound.

In the above structure, when the carrier is an electron, the difference between the lowest unoccupied molecular orbital level of the first organic compound and the lowest unoccupied molecular orbital level of the second organic compound is preferably less than 0.3 eV. In addition, in the above structure, when the carrier is an electron, the first organic compound is preferably a metal complex, and the second organic compound is preferably an aromatic amine compound. Further, in the above structure, when the carrier is a hole, the difference between the highest occupied molecular orbital level of the first organic compound and the highest occupied molecular orbital level of the second compound is preferably less than 0.3 eV. Furthermore, in the above structure, when the carrier is a hole, the first organic compound is preferably an aromatic amine compound, and the second organic compound is preferably a metal complex.

Another aspect of the present invention is a light-emitting element including a light-emitting layer and two layers for controlling movement of carriers between a first electrode and a second electrode. One of the layers for controlling movement of carriers is provided between the light-emitting layer and the second electrode, and the other layer for controlling movement of carriers is provided between the light-emitting layer and the first electrode. The one of the layers for controlling movement of carriers includes a first organic compound having a carrier transporting property and a second organic compound for reducing the carrier transporting property of the first organic compound, and the second organic compound is dispersed in the first organic compound. The other layer for controlling movement of carriers includes a third organic compound having a carrier transporting property and a fourth organic compound for reducing the carrier transporting property of the third organic compound, and the fourth organic compound is dispersed in the third organic compound. The carrier transporting property of the one of the layers for controlling movement of carriers is different from the carrier transporting property of the other layer for controlling movement of carriers.

Another aspect of the present invention is a light-emitting element including a light-emitting layer and a layer for controlling movement of carriers between a pair of electrodes, where the layer for controlling movement of carriers includes a first organic compound and a second organic compound, and the first organic compound and the second organic compound have transport carriers of different polarity from each other.

Another aspect of the present invention is a light-emitting element including a light-emitting layer and a layer for controlling movement of carriers between a pair of electrodes, where the layer for controlling movement of carriers includes a first organic compound and a second organic compound, the first organic compound is an organic compound having electron transporting property, and the second organic compound is an organic compound having hole transporting property.

Another aspect of the present invention is a light-emitting element including a light-emitting layer and a layer for controlling movement of carriers between a first electrode and a second electrode, where the layer for controlling movement of carriers is provided between the light-emitting layer and the second electrode, the layer for controlling movement of carriers includes a first organic compound and a second organic compound, the first organic compound is an organic compound having electron transporting property, the second organic compound is an organic compound having hole transporting property, in the layer for controlling movement of carriers, the proportion of weight of the first organic compound is greater than the proportion of weight of the second organic compound, and when voltage is applied so that potential of the first electrode is higher than potential of the second electrode, light emission from the light-emitting layer can be obtained.

In the above structure, the difference between the lowest unoccupied molecular orbital level of the first organic compound and the lowest unoccupied molecular orbital level of the second organic compound is preferably less than 0.3 eV. In addition, the first organic compound is preferably a metal complex, and the second organic compound is preferably an aromatic amine compound. Further, in the above structure, the light-emitting layer preferably has electron transporting property. Alternatively, it is preferable that the light-emitting layer include a third organic compound and a fourth organic compound, the proportion of weight of the third organic compound be higher than the proportion of weight of fourth organic compound, and the third organic compound have electron transporting property. In this case, the structures of the first organic compound and the third organic compound are preferably different organic compounds from each other.

Another aspect of the present invention is a light-emitting element including a light-emitting layer and a layer for controlling movement of carriers between a first electrode and a second electrode, where the layer for controlling movement of carriers is provided between the light-emitting layer and the first electrode, the layer for controlling movement of carriers includes a rust organic compound and a second organic compound, the first organic compound is an organic compound having hole transporting property, the second organic compound is an organic compound having electron transporting property, in the layer for controlling movement of carriers, the proportion of weight of the first organic compound is greater than the proportion of weight of the second organic compound, and when voltage is applied so that potential of the first electrode is higher than potential of the second electrode, light emission from the light-emitting layer can be obtained.

In the above structure, the difference between the highest occupied molecular orbital level of the first organic compound and the highest occupied molecular orbital level of the second organic compound is preferably less than 0.3 eV. Further, the first organic compound is preferably an aromatic amine compound, and the second organic compound is preferably a metal complex. In addition, in the above structure, the light-emitting layer preferably has hole transporting property. Alternatively, it is preferable that the light-emitting layer include a third organic compound and a fourth organic compound, the proportion of weight of the third organic compound be higher than the proportion of weight of the fourth organic compound, and the third organic compound have hole transporting property. In this case, the structures of the first organic compound and the third organic compound are preferably different organic compounds from each other.

Another aspect of the present invention is a light-emitting element including a light-emitting layer and two layers for controlling movement of carriers between a first electrode and a second electrode. One of the layers for controlling movement of carriers is provided between the light-emitting layer and the second electrode, and the other layer for controlling movement of carriers is provided between the light-emitting layer and the first electrode. The one of the layers for controlling movement of carriers includes a first organic compound having electron transporting property and a second organic compound having hole transporting property, and in the one of the layers for controlling movement of carriers, the proportion of weight of the first organic compound is greater than the proportion of weight of the second organic compound. The other layer for controlling movement of carriers includes a third organic compound having hole transporting property and a fourth organic compound having electron transporting property, and in the other layer for controlling movement of carriers, the proportion of weight of the third organic compound is greater than the proportion of weight of the fourth organic compound. When voltage is applied so that potential of the first electrode is higher than potential of the second electrode, light emission from the light-emitting layer can be obtained.

Another aspect of the present invention is a light-emitting element including a light-emitting layer and a layer for controlling movement of carriers between a pair of electrodes, where the layer for controlling movement of carriers includes a first organic compound and a second organic compound, and when the magnitude of the dipole moment of the first organic compound is $P_1$ and the magnitude of the dipole moment of the second organic compound is $P_2$, a relation of $P_1/P_2 \geq 3$ or $P_1/P_2 \leq 0.33$ is satisfied.

Another aspect of the present invention is a light-emitting element including a light-emitting layer and a layer for controlling movement of carriers between a first electrode and a second electrode, where the layer for controlling movement of carriers is provided between the light-emitting layer and the second electrode, the layer for controlling movement of carriers includes a first organic compound and a second organic compound, when the magnitude of the dipole moment of the first organic compound is $P_1$ and the magnitude of the dipole moment of the second organic compound is $P_2$, $P_1/P_2 \geq 3$ is satisfied, in the layer for controlling movement of carriers, the proportion of weight of the first organic compound is greater than the proportion of weight of the second compound, and when voltage is applied so that potential of the first electrode is higher than potential of the second electrode, light emission from the light-emitting layer can be obtained.

In the above structure, the difference between the lowest unoccupied molecular orbital level of the first organic compound and the lowest unoccupied molecular orbital level of the second organic compound is preferably less than 0.3 eV. Further, the first organic compound is preferably a metal complex, and the second organic compound is preferably an aromatic amine compound. In addition, in the above structure, the light-emitting layer preferably has electron transporting property. Alternatively, it is preferable that the light-emitting layer include a third organic compound and a fourth organic compound, the proportion of weight of the third organic compound be higher than the proportion of weight of the fourth organic compound, and the third organic compound have electron transporting property. In this case, the structures of the first organic compound and the third organic compound are preferably different organic compounds from each other.

Another aspect of the present invention is a light-emitting element including a light-emitting layer and a layer for controlling movement of carriers between a first electrode and a second electrode, where the layer for controlling movement of carriers is provided between the light-emitting layer and the first electrode, the layer for controlling movement of carriers includes a first organic compound and a second organic compound, when the magnitude of the dipole moment of the first organic compound is $P_1$ and the magnitude of the dipole moment of the second organic compound is $P_2$, $P_1/P_2 \leq 0.33$ is satisfied, in the layer for controlling movement of carriers, the proportion of weight of the first organic compound is greater than the proportion of weight of the second organic compound, and when voltage is applied so that potential of the first electrode is higher than potential of the second electrode, light emission from the light-emitting layer can be obtained.

In the above structure, the difference between the highest occupied molecular orbital level of the first organic compound and the highest occupied molecular orbital level of the second organic compound is preferably less than 0.3 eV. Further, the first organic compound is preferably an aromatic amine compound, and the second organic compound is preferably a metal complex. In addition, in the above structure, the light-emitting layer preferably has hole transporting property. Alternatively, it is preferable that the light-emitting layer include a third organic compound and a fourth organic compound, the proportion of weight of the third organic compound be higher than the proportion of weight of the fourth organic compound, and the third organic compound have hole transporting property. In this case, the structures of the first organic compound and the third organic compound are preferably different organic compounds from each other.

Another aspect of the present invention is a light-emitting element including a light-emitting layer and two layers for controlling movement of carriers between a first electrode and a second electrode. One of the layers for controlling movement of carriers is provided between the light-emitting layer and the second electrode, and the other layer for controlling movement of carriers is provided between the light-emitting layer and the first electrode. The one of the layers for controlling movement of carriers includes a first organic compound and a second organic compound; when the magnitude of the dipole moment of the first organic compound is $P_1$ and the magnitude of the dipole moment of the second organic compound is $P_2$, $P_1/P_2 \geq 3$ is satisfied; and in the one of the layers for controlling movement of carriers, the proportion of weight of the first organic compound is greater than the proportion of weight of the second organic compound. The other layer for controlling movement of carriers includes a third organic compound and a fourth organic compound; when the magnitude of the dipole moment of the third organic compound is $P_3$ and dipole moment of the fourth organic compound is $P_4$, $P_3/P_4 \leq 0.33$ is satisfied; and in the other layer for controlling movement of carriers, the proportion of weight of the third organic compound is greater than the proportion of weight of the fourth organic compound. When voltage is applied so that potential of the first electrode is higher than potential of the second electrode, light emission from the light-emitting layer can be obtained.

In the above structure, a thickness of the layer for controlling movement of carriers is preferably greater than or equal to 5 nm and less than or equal to 20 nm. In addition, in the above structure, the layer for controlling movement of carriers and the light-emitting layer are preferably provided to be in contact with each other.

Further, the present invention includes a light-emitting device having the above-described light-emitting element in its category. The light-emitting device in the present specification includes an image display device, a light-emitting device, or a light source (including a lighting device). In addition, the light-emitting device of the present invention includes all the following modules: a module in which a connector such as an FPC (flexible printed circuit), a TAB (tape automated bonding) tape or a TCP (tape carrier package) is attached to a panel provided with a light-emitting element; a module provided with a printed wiring board at the end of the TAB tape or the TCP; and a module in which an IC (integrated circuit) is directly mounted by a COG (chip on glass) method to a substrate on which a light-emitting element is formed.

Furthermore, the present invention includes an electronic device using the light-emitting element of the present invention for the display portion in its category. Accordingly, one feature of the electronic device of the present invention is to include a display portion provided with the above-described light-emitting element and a controller for controlling light emission of the light-emitting element.

In a light-emitting element of the present invention, a layer for controlling movement of carriers is provided, and change with time of carrier balance can be suppressed. Therefore, a light-emitting element having a long lifetime can be obtained. Further, the light-emitting element of the present invention is applied to a light-emitting device and an electronic device, whereby a light-emitting device and an electronic device each of which has high luminous efficiency and reduced power consumption can be obtained. In addition, a light-emitting device and an electronic device each of which has a long lifetime can be obtained.

BRIEF DESCRIPTION OF DRAWINGS

FIGS. 10A and 10B are views showing an active matrix light-emitting device in Embodiment Mode 4 of the present invention.

DETAILED DESCRIPTION OF THE INVENTION

Figure 1A:
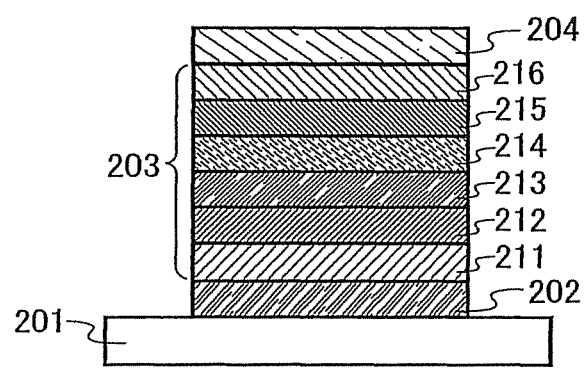
FIGS. 1A and 1B are views showing a light-emitting element in Embodiment Mode 1 of the present invention.

First, luminance decay factors of a light-emitting element will be explained. A light-emitting element is normally driven by a constant current, and in that case, luminance decay indicates reduction in current efficiency. Since current efficiency is a luminance of light per a unit current value, the current efficiency significantly depends on how many flowing carriers contribute to recombination of carriers in a light-emitting layer (carrier balance) or how many carriers that are recombined in the light-emitting layer (that is, exciton) contribute to light emission (quantum yield).

Accordingly, it is considered that change in carrier balance with time or time degradation of quantum yield is a main luminance decay factor. In the present invention, change in carrier balance with time is focused.

Hereinafter, embodiment modes of the present invention will be explained in detail with reference to drawings. However, the present invention is not limited to explanation below, and the present invention is easily understood by those skilled in the art that various changes and modifications are possible, unless such changes and modifications depart from the content and the scope of the invention. Therefore, the present invention is not construed as being limited to the description of the following embodiment modes.

Embodiment Mode 1

A mode of a light-emitting element of the present invention will be explained below with reference to FIG. 1A. In this embodiment mode, a light-emitting element provided with a layer for controlling movement of electrons as a layer for controlling movement of carriers will be explained. That is, in the present invention, carriers are recombined in a portion away from the electrodes using the layer for controlling movement of carriers in order to suppress change in carrier balance with time and to make a light-emitting element have a long lifetime.

In a light-emitting element of the present invention, a plurality of layers are provided between a pair of electrodes. The plurality of layers are stacked by combining layers including a substance having a high carrier injecting property or a substrate having a high carrier transporting property so that a light-emitting region is formed in a portion away from the electrodes, in other words, carriers are recombined in a portion away from the electrodes.

In this embodiment mode, the light-emitting element includes a first electrode 202, a second electrode 204, and an EL layer 203 provided between the first electrode 202 and the second electrode 204. It is to be noted that this embodiment mode is explained below on the assumption that the first electrode 202 serves as an anode and the second electrode 204 serves as a cathode. That is, this embodiment mode is explained below on the assumption that, when a voltage is applied to the first electrode 202 and the second electrode 204 so that potential of the first electrode 202 is higher than potential of the second electrode 204, light emission can be obtained.

A substrate 201 is used as a base of the light-emitting element. As the substrate 201, glass, plastic, or the like can be used, for example. In the light-emitting element of the present invention, the substrate 201 may be left in a light-emitting device or an electronic device each of which uses the light-emitting element. Further, the substrate 201 may serve as a base in the manufacturing process of the light-emitting element. In that case, the substrate 201 is not left in a manufactured product ultimately.

As a material used for the first electrode 202, a metal, an alloy, an electroconductive compound, a mixture thereof, or the like with a high work function (specifically, a work function of 4.0 eV or higher) is preferably used. Specifically, for example, indium oxide-tin oxide (ITO: Indium Tin Oxide), indium oxide-tin oxide containing silicon or silicon oxide, indium oxide-zinc oxide (IZO: Indium Zinc Oxide), indium oxide containing tungsten oxide and zinc oxide (IWZO), and the like can be given.

Such conductive metal oxide films are usually formed by sputtering, but may also be formed by ink-jet, spin coating, or the like by application of sol-gel method or the like. For example, indium oxide-zinc oxide (IZO) can be formed by sputtering using a target in which zinc oxide of 1 to 20 wt % is added to indium oxide. Indium oxide containing tungsten oxide and zinc oxide (IWZO) can be formed by sputtering using a target containing tungsten oxide of 0.5 to 5 wt % and zinc oxide of 0.1 to 1 wt % with respect to indium oxide. Other than these, gold (Au), platinum (Pt), nickel (Ni), tungsten (W), chromium (Cr), molybdenum (Mo), iron (Fe), cobalt (Co), copper (Cu), palladium (Pd), titanium (Ti), nitrides of the metal materials (such as titanium nitride: TiN), and the like can be given.

In a case where a layer including a composite material described below is used as a layer in contact with the first electrode, various metals, alloys, electroconductive compounds, and mixture thereof can be used as the first electrode regardless of the work functions. For example, aluminum (Al), silver (Ag), an alloy containing aluminum (AlSi or the like), or the like can be used. It is to be noted that the term "composition" indicates not just mixing two materials simply, but a state in which charges can be donated and received between materials by mixture of a plurality of materials.

Further, a metal of an element belonging to Group 1 or Group 2 in the periodic table, which is a low work function material, that is, an alkali metal such as lithium (Li) or cesium (Cs), an alkaline earth metal such as magnesium (Mg), calcium (Ca), or strontium (Sr), an alloy including these metals (such as an MgAg alloy or an AlLi alloy), a rare earth metal such as europium (Eu) or ytterbium (Yb), an alloy including such rare earth metals, or the like can be used. A film of an alkali metal, an alkaline earth metal, or an alloy including these can be formed by vacuum evaporation. In addition, an alloy including an alkali metal or an alkaline earth metal can be formed by a sputtering. Further, silver paste or the like can be formed by ink-jet.

The EL layer 203 has a first layer 211, a second layer 212, a third layer 213, a fourth layer 214, a fifth layer 215, and a sixth layer 216. In this EL layer 203, the third layer 213 is a light-emitting layer, and the fourth layer 214 is a layer for controlling movement of carriers. It is acceptable as long as the EL layer 203 includes a layer for controlling movement of carriers shown in this embodiment mode and a light-emitting layer, and the other layers are not particularly limited. For example, the EL layer 203 can be formed by appropriate combination of a hole injecting layer, a hole transporting layer, a light-emitting layer, a layer for controlling movement of carriers, an electron transporting layer, an electron injecting layer, and the like.

The first layer 211 is a layer including a substance having a high hole injecting property. As the substance having a high hole injecting property, molybdenum oxide (MoOx), vanadium oxide (VOx), ruthenium oxide (RuOx), tungsten oxide (WOx), manganese oxide (MnOx), or the like can be used. In addition, as a low molecular organic compound, a phthalocyanine-based compound such as phthalocyanine (abbreviation: H$_2$Pc), copper (II) phthalocyanine (abbreviation: CuPc), or vanadyl phthalocyanine (VOPc) can be given.

Furthermore, aromatic amine compounds can be given, such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphtyl)-N-(9-phenylcarbazole-3-yl)amino]-9-phenylcarbazole (abbreviation: PCzPCN1). In addition, other compounds can be given.

As the first layer 211, a composite material in which an acceptor substance is mixed into a substance having a high hole transporting property can be used. It is to be noted that, by using the composite material in which an acceptor substance is mixed into a substance having a high hole transporting property, a material used to form an electrode can be selected regardless of its work function. In other words, besides a material with a high work function, a material with a low work function may also be used as the first electrode 202. Such composite materials can be formed by co-evaporation of a substance having a high hole transporting property and an acceptor substance.

As an organic compound used for the composite material, various compounds can be used, such as aromatic amine compounds, carbazole derivatives, aromatic hydrocarbons, and high molecular compounds (such as oligomer, dendrimer, and polymer). As the organic compound used for the composite material, an organic compound having a high hole transporting property is preferably used. Specifically, a substance having hole mobility of $10^{-6}$ cm$^2$/Vs or higher is preferably used. However, other substances than those may also be used as long as the substances have higher hole transporting properties than electron transporting properties. Organic compounds that can be used for the composite material will be specifically shown below.

As the organic compound that can be used for the composite material, the following materials can be given, for example: aromatic amine compounds such as MTDATA, TDATA, DPAB, DNTPD, DPA3B, PCzPCA1, PCzPCA2, PCzPCN1, 4,4'-bis[N-(1-naphtyl)-N-phenylamino]biphenyl (abbreviation: NPB or α-NPD), and N,N'-bis(3-methylphenyl)-N,N'-diphenyl-[1,1'-biphenyl]-4,4'-diamine (abbreviation: TPD); or carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Furthermore, the following aromatic hydrocarbon compounds can be given, such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracen, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

As an acceptor substance, organic compounds such as 7,7,8,8-tetracyano-2,3,5,6-tetrafluoroquinodimethane (abbreviation: $F_4$-TCNQ) and chloranil can be given. In addition, a transition metal oxide can be given. In addition, oxides of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because their electron accepting properties are high. Among these, molybdenum oxide is especially preferable because it is stable in the air and its hygroscopic property is low so that it can be easily treated.

As the first layer 211, high molecular compounds (such as oligomer, dendrimer, and polymer) can be used. For example, the following high molecular compound can be used: poly(N-vinylcarbazole) (abbreviation: PVK); poly(4-vinyltriphenylamine) (abbreviation: PVTPA); poly[N-(4-{N'-[4-(4-diphenylamino)phenyl]phenyl-N'-phenylamino}phenyl) methacrylamide] (abbreviation: PTPDMA); and poly[N,N'-bis(4-butylphenyl)-N,N'-bis(phenyl)benzidine] (abbreviation: Poly-TPD). In addition, high molecular compounds doped with acid such as poly(3,4-ethylenedioxythiophene)/poly(styrenesulfonic acid) (PEDOT/PSS), and polyanline/poly(styrenesulfonic acid) (PAni/PSS) can be used. Further, the first layer 211 may be formed using a composite material that is formed using the above high molecular compound such as PVK, PVTPA, PTPDMA, or Poly-TPD and the above acceptor substance.

The second layer 212 is a layer including a substance having a high hole transporting property. As a low molecular organic compound of a substance having a high hole transporting property, aromatic amine compounds such as NPB (or α-NPD), TPD, 4,4'-bis[N-(9,9-dimethylfluoren-2-yl)-N-phenylamino]biphenyl (abbreviation; DFLDPBi), and 4,4'-bis[N-(spiro-9,9'-bifluoren-2-yl)-N-phenylamino]biphenyl (abbreviation: BSPB) can be used. These substances are mainly substances each having a hole mobility of $10^{-6}$ cm$^2$/Vs or higher.

However, other substances than these may also be used as long as the hole transporting properties thereof are higher than the electron transporting properties. The layer including a substance having a high hole transporting property is not limited to a single layer, but two or more layers including the aforementioned substances may be stacked. Further, as the second layer 212, high molecular compounds such as PVK, PVTPA, PTPDMA, and Poly-TPD can be used.

The third layer 213 is a layer including a substance having a high light-emitting property, which corresponds to a light-emitting layer of the present invention, and various materials can be used. Specifically, as a low molecular organic compound of a light-emitting material that exhibits emission of bluish light, N,N'-bis[4-(9H-carbazol-9-yl)phenyl]-N,N'-diphenylstylbene-4,4'-diamine (abbreviation: YGA2S), 4-(9H-carbazol-9-yl)-4'-(10-phenyl-9-anthryl)triphenylamine (abbreviation: YGAPA), and the like can be given. As a light-emitting material that exhibits emission of greenish light, N-(9,10-diphenyl-2-anthryl)-N,9-diphenyl-9H-carbazol-3-amine (abbreviation: 2PCAPA), N[9,10-bis(1,1'-biphenyl-2-yl)-2-anthryl]-N,9-diphenyl-9H-carbazole-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-9,10-bis(1,1'-biphenyl-2-yl)-N-[4-(9H-carbazol-9-yl)phenyl]-N-phenylanthracene-2-a mine (abbreviation: 2YGABPhA), N,N,9-triphenylanthracen-9-amine (abbreviation: DPhAPhA), and the like can be given. As a light-emitting material that exhibits emission of yellowish light, rubrene, 5,12-bis(1,1'-biphenyl-4-yl)-6,11-diphenyltetracene (abbreviation: BPT), and the like can be given. As a light-emitting material that exhibits emission of reddish light, N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-α]fluoranthene-3,10-diamine (abbreviation: p-mPhAFD), and the like can be given.

Since the layer for controlling movement of carriers is provided between the light-emitting layer and the second electrode serving as a cathode in this embodiment mode, the light-emitting layer preferably has an electron transporting property. In a case where the light-emitting layer has an electron transporting property, an electron blocking layer is conventionally provided between the light-emitting layer and an anode in order to prevent penetration of electrons from the light-emitting layer. However, when the electron blocking function deteriorates with time, a recombination region expands to the inside of the electron blocking layer (or the inside of the hole transporting layer), and reduction in current efficiency (that is, luminance decay) becomes significant. On the other hand, in the present invention, the electron blocking layer is provided before the light-emitting layer (on the cathode side) to control movement of electrons. Therefore, even when balance of the electrons (e.g., mobility or the amount of elections relative to that of holes) is more or less lost, there is an advantage that the ratio of recombination in the light-emitting layer is hardly changed and luminance is hardly lowered.

It is to be noted that the light-emitting layer may have a structure in which the above substance having a high light-emitting property is dispersed in another substance. As a material in which the substance having light-emitting property is dispersed, various kinds of materials can be used, and a substance is preferably used, which has a lowest unoccupied molecular orbital level (LUMO level) that is higher than that of the substance having light-emitting property and has a highest occupied molecular orbital level (HOMO level) that is lower than that of the substance having light-emitting property.

Since, the layer for controlling movement of carriers is provided between the light-emitting layer and the second electrode serving as a cathode in this embodiment mode, the light-emitting layer preferably has an electron transporting property. That is, it is preferable that the electron transporting property be higher than the hole transporting property. Therefore, as a material in which a substance having a high light-emitting property is dispersed, an organic compound having an electron transporting property is preferably used. Specifically, the following materials can be used: metal complexes such as tris(8-quinolinolato)aluminum(III) (abbreviation: Alq), tris(4-methyl-8-quinolinolato)aluminum (III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis [2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl- 1H-benzimidazole) (abbreviation: TPBI), bathophenanthroline (abbreviation: BPhen), and bathocuproine (abbreviation: BCP); or condensed aromatics such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDBA), 9,9'-bianthryl (BANT), 9,9'-(stilben-3,3'-diyl)diphenanthrene (abbreviation: DPNS), 9,9'-(stilben-4,4'-diyl)diphenanthrene (abbreviation: DPNS2), and 3,3',3"-(benzene-1,3,5-triyl) tripyrene (abbreviation: TPB3).

Further, as the material in which a substance having light-emitting property is dispersed, a plural kinds of materials can be used. For example, in order to suppress crystallization, a substance for suppressing crystallization of rubrene or the like may be further added. Furthermore, in order to efficiently transfer energy to the substance having light-emitting property, NPB, Alq or the like may be further added. When the substance having a high light-emitting property is dispersed in another substance, crystallization of the third layer 213 can be suppressed. Further, concentration quenching due to high concentration of the substance having a high light-emitting property can be suppressed.

As the third layer 213, high molecular compounds can be used. Specifically, as a light-emitting material that exhibits emission of bluish light, poly(9,9-dioctylfluorene-2,7-diyl) (abbreviation: POF), poly[(9,9-dioctylfluorene-2,7-diyl)-co-(2,5-dimethoxybenzen-1,4-diyl)] (abbreviation: PF-DMOP), poly{(9,9-dioctylfluorene-2,7-diyl)-co-[N,N'-di-(p-butylphenyl)-1,4-diaminobenzene]} (abbreviation: TAB-PFH), or the like can be given. As a light-emitting material that exhibits emission of greenish light, poly(p-phenylenvinylene) (abbreviation: PPV), poly[(9,9-dihexylfluorene-2,7-diyl)-alt-co-(benzo[2,1,3]thiadiazol-4,7-diyl)] (abbreviation: PFBT), poly[(9,9-dioctyl-2,7-divinylenfluorenylene)-alt-co-(2-methoxy-5-(2-ethylhexyloxy)-1,4-phenylene)], or the like can be given. As a light-emitting material that exhibits emission of orangish to reddish light, poly[2-methoxy-5-(2'-ethylhexoxy)-1,4-phenylenevinylene] (abbreviation: MEH-PPV), poly(3-butylthiophene-2,5-diyl), poly{[9,9-dihexyl-2,7-bis(1-cyanovinylene)fluorenylene]-alt-co-[2,5-bis(N,N'-diphenyl amino)-1,4-phenylene]}, poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD), or the like can be given.

The fourth layer 214 is a layer for controlling movement of carriers. The fourth layer 214 includes two or more kinds of substances. In the fourth layer 214, the proportion of weight of the first organic compound is greater than the proportion of weight of the second organic compound, and the first organic compound and the second compound have transport carriers of different polarity from each other. In this embodiment mode, a case where the layer for controlling movement of carriers is provided between the third layer 213, which has a light-emitting function (light-emitting layer) and the second electrode 204, which serves as a cathode, is explained.

In a case where the layer for controlling movement of carriers is provided closer to the side of the second electrode serving as a cathode than to the light-emitting layer, the first organic compound is preferably an organic compound having electron transporting property, and the second organic compound is preferably an organic compound having hole transporting property. That is, the first organic compound is preferably a substance in which an electron transporting property is higher than a hole transporting property. The second organic compound is a preferably a substance in which a hole transporting property is higher than an electron transporting property. Further, the difference between the lowest unoccupied molecular orbital level (LUMO level) of the first organic compound and the lowest unoccupied molecular orbital level (LUMO level) of the second organic compound is preferably less than 0.3 eV, further preferably, 0.2 eV or less. That is, thermodynamically, it is preferable that electrons that are carriers be easily moved between the first organic compound and the second organic compound.

Figure 4:
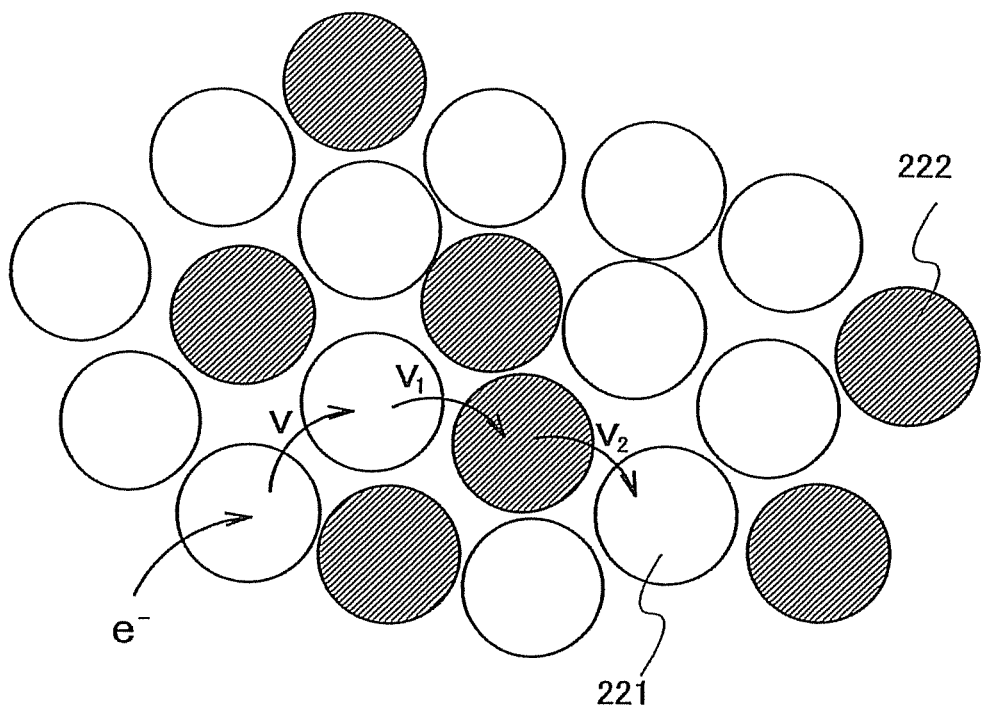
FIG. 4 is a view showing a concept of a layer for controlling movement of carriers in a light-emitting element in Embodiment Mode 1 of the present invention.

FIG. 4 shows a conceptual view of a layer for controlling movement of carriers shown in this embodiment mode. In FIG. 4, since a first organic compound 221 has electron transporting property, electrons are easily injected thereto and moved to near another first organic compound. That is, the rate at which electrons are injected to the first organic compound and the rate at which the electrons are discharged from the first organic compound are high.

On the other hand, since a second organic compound 222, which is an organic compound having hole transporting property, has a LUMO level that is close to a LUMO level of the first organic compound, electrons can be injected to the first organic compound 221, thermodynamically. However, the rate ($v_1$) at which electrons are injected from the first organic compound 221, which is an organic compound having electron transporting property, to the second organic compound 222, which is an organic compound having hole transporting property, or the rate ($v_2$), at which electrons are injected from the second organic compound 222 to the first organic compound 221, is lower than the rate (v) at which electrons are injected from the first organic compound 221 to another first organic compound 221.

Therefore, by inclusion of the second organic compound, the electron transporting rate of the entire layer becomes lower than that of the layer including only the first organic compound. That is, by addition of the second organic compound, movement of carriers can be controlled. Further, by control of the concentration of the second organic compound, the rate of movement of carriers can be controlled.

For example, in a conventional light-emitting element in which the fourth layer 214 that is a layer for controlling movement of carriers is not provided, electrons are injected to the third layer 213 in a state where the rate of movement of electrons is not lowered, and the electrons reach the vicinity of the interface between the third layer 213 and the second layer 212. Therefore, a light-emitting region is formed in the vicinity of the interface between the second layer 212 and the third layer 213. In that case, the electrons reach the second layer 212, and therefore, there is a possibility in that the second layer 212 is deteriorated. As the number of electrons reaching the second layer 212 is increased with time, probability of recombination of carriers is reduced with time; accordingly, reduction in element lifetime (luminance decay with time) is realized.

In the light-emitting element of the present invention, electrons injected from the second electrode 204 pass through the sixth layer 216 including a substance having a high electron injecting property and the fifth layer 215 including a substance having a high electron transporting property, and are injected to the fourth layer 214, which is a layer for controlling movement of carriers. Movement rate of the electrons injected to the fourth layer 214 becomes slow, and the electron injection to the third layer 213 is controlled. As a result, the light-emitting region is formed in a region from the third layer 213 to the vicinity of the interface between the third layer 213 and the fourth layer 214 in the light-emitting element of the present invention, although the light-emitting region has been formed in the vicinity of the interface between the second layer 212 including a substance having a high hole transporting property and the third layer 213 in a conventional light-emitting element. Accordingly, the possibility that the electrons reach the second layer 212, which could deteriorate the second layer 212 including a substance having a high hole transporting property, is reduced. Further, regarding holes, since the fourth layer 214 includes the first organic compound having an electron transporting property, there is a low possibility in that the fifth layer 215 including a substance having a high electron transporting property is deteriorated by holes reaching the fifth layer 215.

Furthermore, it is important in the present invention that an organic compound having a hole transporting property is added to an organic compound having an electron transporting property in the fourth layer 214, instead that a substance electron mobility of which is low is just applied. When such a structure is employed, in addition to just control of electron injection to the third layer 213, which is a light-emitting layer, change with time of the number of electron injection that is controlled can be suppressed. Accordingly, in the light-emitting element of the present invention, a phenomenon can be prevented, in which carrier balance is deteriorated with time and probability of recombination is reduced; therefore, improvement in element lifetime (suppression of luminance decay with time) is achieved.

As described above, in the light-emitting element of the present invention, since a light-emitting region is hard to be formed at the interface between the light-emitting layer and the hole transporting layer or at the interface between the light-emitting layer and the electron transporting layer, the light-emitting element is hard to deteriorate due to proximity of the light-emitting region to the hole transporting layer or the electron transporting layer. In addition, change in carrier balance with time (particularly, change with time of the quantity of electron injection) can be suppressed. Therefore, a light-emitting element having little deterioration and a long lifetime can be obtained.

As described above, the first organic compound is preferably an organic compound having an electron transporting property in this embodiment mode. Specifically, metal complexes such as Alq, Almq$_3$, BeBq$_2$, BAlq, Znq, ZnPBO, and ZnBTZ; heterocyclic compounds such as PBD, OXD-7, TAZ, TPBI, BPhen, and BCP; or condensed aromatics such as CzPA, DPCzPA, DPPA, DNA, t-BuDNA, BANT, DPNS, DPNS2, and TPB3 can be used. Further, high molecular compounds can be used, such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy).

As the second organic compound, an organic compound having a hole transporting property is preferably used. Specifically, the following can be used: condensed aromatic hydrocarbons such as 9,10-diphenylanthracene (abbreviation: DPAnth) and 6,12-dimethoxy-5,11-diphenycrysene; aromatic amine compounds such as N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB; or compounds including an amino group such as Coumarin 7 or Coumarin 30. Furtherer, high molecular compounds such as PVK, PVTPA, PTPDMA, and Poly-TPD can be used.

By the above combination, movement of electrons from the first organic compound to the second organic compound or movement of electrons from the second organic compound to the first organic compound is suppressed, whereby the movement rate of electrons in the layer for controlling movement of carriers can be suppressed. The layer for controlling movement of carriers is formed, by dispersing the second organic compound in the first organic compound; therefore, crystallization or agglomeration is hardly caused with time. Accordingly, the above-described suppression effect of movement of electrons is hardly changed with time, and as a result, the carrier balance is hardly changed with time. This leads to improvement in lifetime of the light-emitting element, in other words, improvement in reliability.

It is to be noted that, in the above combination, a metal complex as the first organic compound and an aromatic amine compound as the second organic compound are preferably combined. A metal complex has a high electron transporting property and a large magnitude of its dipole moment, whereas an aromatic amine compound has a high hole transporting property and a comparatively small magnitude of its dipole moment. In such a manner, by combination of substances dipole moments of which are largely different from each other, the above suppression effect of movement of electrons becomes further significant. Specifically, when the magnitude of the dipole moment of the first organic compound is $P_1$ and the magnitude of the dipole moment of the second organic compound is $P_2$, a combination of $P_1/P_2 \geq 3$ or $P_1/P_2 \leq 0.33$ is preferably satisfied. For example, dipole moment of Alq that is a metal complex is 9.40 debye, and the dipole moment of 2PCAPA that is an aromatic amine compound is 1.15 debye. Accordingly, when an organic compound having electron transporting property like a metal complex is used as the first organic compound and an organic compound having hole transporting property like an aromatic amine compound is used as the second organic compound, $P_1/P_2 \geq 3$ is preferably satisfied.

The emission color of the second organic compound included in the fourth layer 214 and the emission color of the substance having a high light-emitting property included in the third layer 213 are preferably similar colors. Specifically, the difference between the wavelength of the highest peak of the emission spectrum of the second organic compound and the wavelength of the highest peak of the emission spectrum of the substance having light-emitting property is preferably within 30 nm. When the difference is within 30 nm, the emission color of the second organic compound and the emission color of the substance having a high light-emitting property can be similar colors. Accordingly, even in a case where the second organic compound emits light due to change of voltage or the like, change in emission color can be suppressed. However, the second organic compound has no necessity to emit light.

Further, the thickness of the fourth layer 214 is preferably greater than or equal to 5 nm and less than or equal to 20 nm. When the fourth layer 214 is too thick, the rate of movement of carries is excessively reduced, and a driving voltage is increased. In addition, the emission intensity of the fourth layer may be increased. Alternatively, when the fourth layer is too thin, the function of controlling movement of carriers is not realized. Therefore, the thickness is preferably greater than or equal to 5 nm and less than or equal to 20 nm.

The fifth layer 215 is a layer including a substance having a high electron transporting property. For example, as a low molecular organic compound, metal complexes such as Alq, Almq$_3$, BeBq$_2$, BAlq, Znq, ZnPBO, and ZnBTZ, or the like can be used. Besides the metal complex, heterocyclic compounds such as PBD, OXD-7, TAZ, TPBI, BPhen, and BCP can be used. The substances mentioned here are mainly substances having an electron mobility of $10^{-6}$ cm$^2$/Vs or higher. If a substance has a higher electron transporting property than a hole transporting property, substances other than the above may be used for the electron transporting layer. Further, the electron transporting layer may be a stacked layer of two or more layers formed from the above substances as well as a single layer.

As the fifth layer 215, high molecular compounds may be used. For example, poly[(9,9-dihexylfluorene-2,7-diyl)-co-(pyridine-3,5-diyl)] (abbreviation: PF-Py), poly[(9,9-dioctylfluorene-2,7-diyl)-co-(2,2'-bipyridine-6,6'-diyl)] (abbreviation: PF-BPy), and the like can be used.

The sixth layer 216 is a layer including a substance having a high electron injecting property. As the substance having a high electron injecting property, alkali metals, alkaline earth metals, or compounds thereof such as lithium fluoride (LiF), cesium fluoride (CsF), and calcium fluoride (CaF$_2$) can be used. Further, a layer of a substance having electron transporting property, which contains alkali metals, alkaline earth metals, or compounds thereof such as Alq containing magnesium (Mg), may be used. With the use of a layer of a substance having electron transporting property that contains an alkali metal or an alkaline earth metal as the electron injecting layer, electron injection from the second electrode 204 is performed efficiently, which is preferable.

As a substance for forming the second electrode 204, a metal, an alloy, an electroconductive compound, or a mixture thereof, or the like with a low work function (specifically, a work function of 3.8 eV or lower) can be used. As a specific example of such a cathode material, an element that belongs to Group 1 or 2 of the periodic table, that is, alkali metals such as lithium (Li) and cesium (Cs), alkaline earth metals such as magnesium (Mg), calcium (Ca), and strontium (Sr), alloys containing these (MgAg, AlLi, or the like), rare earth metals such as europium (Eu) and ytterbium (Yb), alloys containing these, and the like can be given. A film of an alkali metal, an alkaline earth metal, an alloy containing these can be formed by a sputtering method. Further, an alloy containing an alkali metal or an alkaline earth metal can be formed by a sputtering method. A silver past or the like can be formed by an inkjet method or the like.

Further, by the sixth layer 216, which has a function of promoting electron injection being provided between the second electrode 204 and the fifth layer 215, various conductive materials such as Al, Ag, ITO, or indium oxide-tin oxide containing silicon or silicon oxide can be used as the second electrode 204 regardless of their work functions. These conductive materials can be formed by sputtering, inkjet, spin coating or the like.

Various methods can be used for forming the EL layer, regardless of a dry method or a wet method. For example, a vacuum evaporation, inkjet, spin coating or the like may be used. Furthermore, the electrodes or the layers may be formed by different film formation methods. For example, the EL layer may be formed by a wet method using a high molecular compound selected from the above-described materials. Further, the EL layer can also be formed by a wet method using a low molecular organic compound. Furthermore, the EL layer may be formed by a dry method such as vacuum evaporation using a low molecular organic compound.

The electrode may be formed by a wet method using sol-gel method, or by a wet method using a paste of a metal material. Further, the electrode may be formed by a dry method such as sputtering or vacuum evaporation.

Hereinafter, specific methods of forming a light-emitting element are described. In a case where the light-emitting element of the present invention is applied to a display device and light-emitting layers are formed by separately applying mixture including a material for the light-emitting layers, the light-emitting layers are preferably formed by a wet method. When the light-emitting layers are formed using inkjet, it becomes easy to form the light-emitting layers by separately applying mixture including a material for the light-emitting layers even on a large-sized substrate.

Figure 1B:
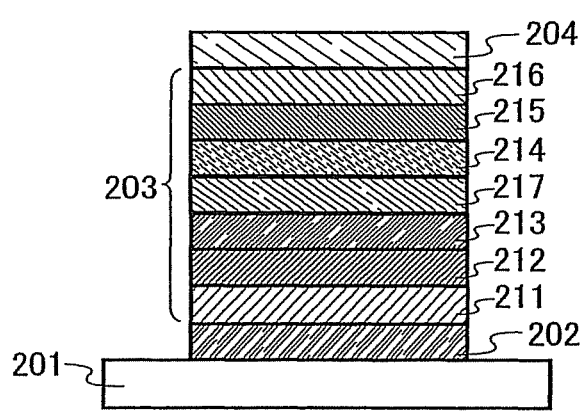

For example, in the structure shown in FIGS. 1A and 1B, the first electrode may be formed by sputtering, which is a dry method, the first layer may be formed by inkjet or spin coating, which is a wet method, the second layer may be formed by vacuum evaporation, which is a dry method, the third layer may be formed by inkjet, which is a wet method, the fourth layer may be formed by co-evaporation, which is a dry method, the fifth layer and the sixth layer may be formed by vacuum evaporation, which is a dry method, and the second electrode may be formed by inkjet or spin coating, which is a wet method.

Alternatively, the first electrode may be formed by inkjet, which is a wet method, the first layer may be formed by vacuum evaporation, which is a dry method, the second layer may be formed by inkjet or spin coating, which is a wet method, the third layer may be formed by inkjet, which is a wet method, the fourth layer may be formed by inkjet or spin coating, which is a wet method, the fifth layer and the sixth layer may be formed by inkjet or spin coating, which is a wet method, and the second electrode may be formed by inkjet or spin coating, which is a wet method. The method for forming the light-emitting element is not particularly limited to the above method, and a wet method and a dry method may be combined as appropriate.

For example, in the case of the structures shown in FIGS. 1A and 1B, the first electrode can be formed by sputtering, which is a dry method, the first layer and the second layer can be formed by inkjet or spin coating, which is a wet method, the third layer, which is a light-emitting layer, can be formed by inkjet, which is a wet method, the fourth layer can be formed by co-evaporation, which is a dry method, the fifth layer and the sixth layer can be formed by vacuum evaporation, which is a dry method, and the second electrode can be formed by vacuum evaporation, which is a dry method. That is, over a substrate over which the first electrode is formed in the predetermined shape, the first layer to third layer can be formed by wet methods, and the fourth layer to the second electrode can be formed by dry methods. By this method, the first layer to the third layer can be formed under an atmospheric pressure, and it is easy to form the third layers by separately applying mixture including a material for the light-emitting layers. Further, the fourth layer to the second electrode can be consecutively formed in a vacuum. Therefore, the steps can be simplified, and productivity can be improved.

One example is shown below. PEDOT/PSS is faulted as the first layer over the first electrode. Since PEDOT/PSS has water solubility, PEDOT/PSS can be formed as an aqueous solution by a spin coating method, an inkjet method, or the like. The third layer is provided as a light-emitting layer over the first layer without providing the second layer. The light-emitting layer can be formed by an inkjet method using a solution in which a substance having light-emitting property is dissolved in a solvent (such as toluene, dodecylbenzene, or a mixed solvent of dodecylbenzene and tetralin) that does not dissolve the first layer (PEDOT/PSS) that is previously formed. Next, the fourth layer is formed over the third layer. In the case of forming the fourth layer by a wet method, the fourth layer is required to be formed using a solvent that does not dissolves the first layer that is previously formed and third layer. In that case, since the selection range of the solvent is narrowed, the fourth layer is easily formed using a dry method. Therefore, when the fourth layer to the second electrode are consecutively formed in a vacuum by a vacuum evaporation method that is a dry method, the steps can be simplified.

In the case of the structure of FIGS. 2A and 2B, the light-emitting element can be formed in the reverse order of the above method as follows: the second electrode can be formed by a sputtering method or a vacuum evaporation method that is a dry method; the sixth layer and the fifth layer can be formed by a vacuum evaporation method that is a dry method; the fourth layer can be formed by a co-evaporation method that is a dry method; the third layer can be formed by an inkjet method that is a wet method; the second layer and the first layer can be formed by an inkjet method and a spin coating method that is a wet method; and the first electrode can be formed by an inkjet method or a spin coating method that is a wet method. By this method, the second electrode to the fourth layer can be consecutively formed in a vacuum by a dry method, and the third layer to the first electrode can be formed in an atmospheric pressure. Therefore, the steps can be simplified, and productivity can be improved.

In the light-emitting element having the above structure of the present invention, current flows by a potential difference generated between the first electrode 202 and the second electrode 204, and holes and electrons are recombined in the EL layer 203, whereby the light-emitting element emits light. Light emission is extracted to the outside through one of or both the first electrode 202 and the second electrode 204. Accordingly, one of or both the first electrode 202 and the second electrode 204 are an electrode having light transmitting property.

Figure 3A:
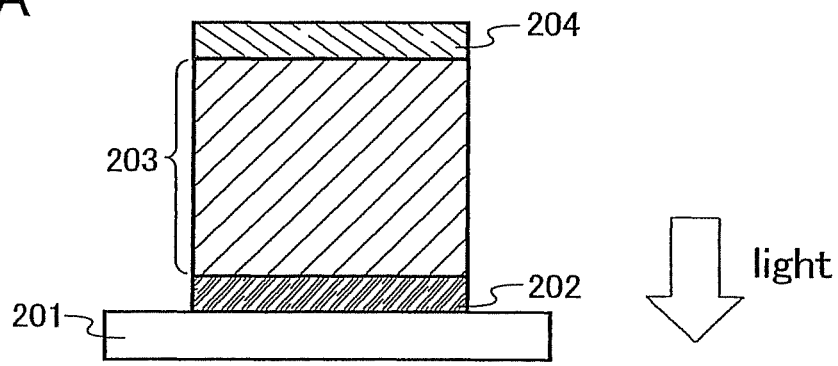
FIGS. 3A to 3C are views showing a light emission mode of a light-emitting element in Embodiment Mode 1 of the present invention.
Figure 3B:
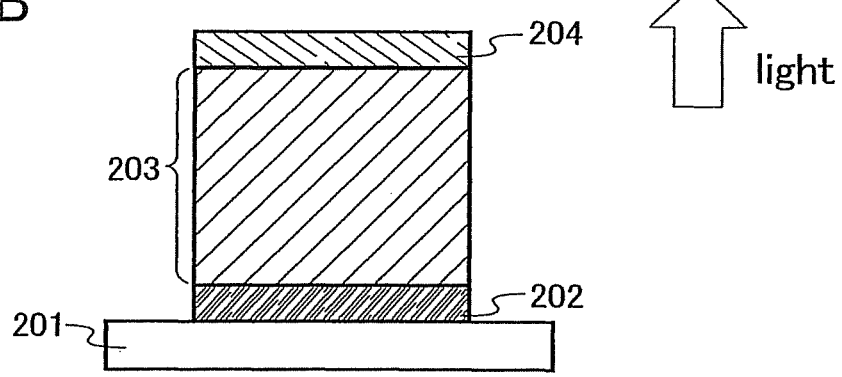
Figure 3C:
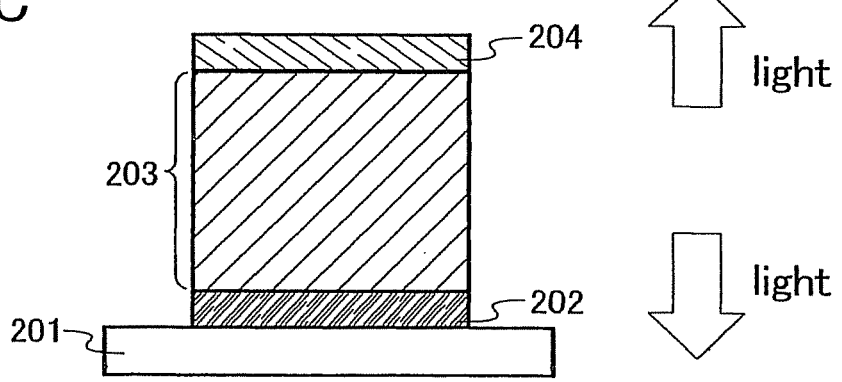

When only the first electrode 202 has light transmitting property, light emission is extracted from the substrate side through the first electrode 202 as shown in FIG. 3A. When only the second electrode 204 has light transmitting property, light emission is extracted from the opposite side of the substrate through the second electrode 204 as shown in FIG. 3B. When both the first electrode 202 and the second electrode 204 have light transmitting property, light emission is extracted from both the substrate side and the opposite side to the substrate through the first electrode 202 and the second electrode 204 as shown in FIG. 3C.

The structure of the layer provided between the first electrode 202 and the second electrode 204 is not limited to the above structure. Any structure other than the above may be employed as long as a light-emitting region in which holes and electrons are recombined is provided in a portion away from the first electrode 202 and the second electrode 204 in order to prevent quenching caused by proximity of the light-emitting region to a metal, and a layer for controlling movement of carriers is provided.

That is, the stacked structure of the EL layer is not particularly limited. The EL layer may be formed by appropriate combination of a layer including a substance having a high electron transporting property, a substance having a high hole transporting property, a substance having a high electron injecting property, a substance having a high hole injecting property, a substance having a bipolar property (a substance having a high electron and hole transporting properties), and the like; a layer for controlling movement of carriers shown in this embodiment mode; and a light-emitting layer.

Since a layer for controlling movement of carriers shown in this embodiment mode is a layer for controlling movement of electrons, the layer for controlling movement of carriers is preferably provided between the electrode serving as a cathode and the light-emitting layer. For example, as shown in FIG. 1B, a seventh layer 217 including a substance having a high electron transporting property may be provided between the third layer 213 having a light-emitting function and the fourth layer 214 that is a layer for controlling movement of carriers.

Further preferably, the layer for controlling movement of carriers is provided so as to be in contact with the light-emitting layer. When the layer for controlling movement of carriers is provided so as to be in contact with the light-emitting layer, electron injection to the light-emitting layer can be directly controlled. Therefore, change in carrier balance with time can be further suppressed in the light-emitting element, and further increased effect of improvement in element lifetime can be obtained. In addition, the seventh layer 217 including a substance having a high electron transporting property does not need to be provided, whereby the process becomes simple.

It is to be noted that the layer for controlling movement of carriers is preferably provided so as to be in contact with the light-emitting layer, and in such a case, the structures of the first organic compound included in the layer for controlling movement of carriers and an organic compound occupying large part of the light-emitting layer are preferably different from each other. In particular, in the case where the light-emitting layer includes a substance in which a substance having a high light-emitting property (a third organic compound) is dispersed and the substance having a high light-emitting property (a fourth organic compound), the structures of the third organic compound and the first organic compound are preferably different from each other. In such a structure, movement of carriers (movement of electrons in this embodiment mode) from the layer for controlling movement of carriers to the light-emitting layer is suppressed also between the first organic compound and the third organic compound, and effect of providing the layer for controlling movement of carriers is further increased.

Figure 2A:
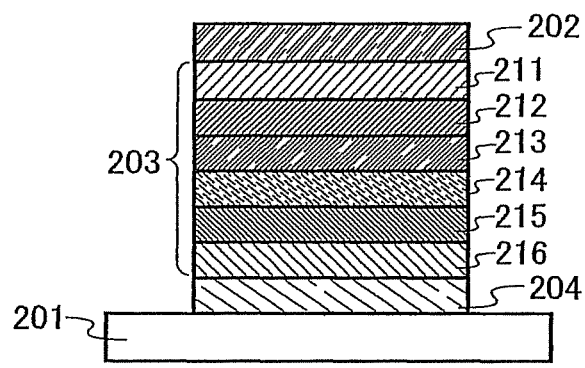
FIGS. 2A and 2B are views showing a light-emitting element that has a different stacked structure from that of FIGS. 1A and 1B in Embodiment Mode 1 of the present invention.
Figure 2B:
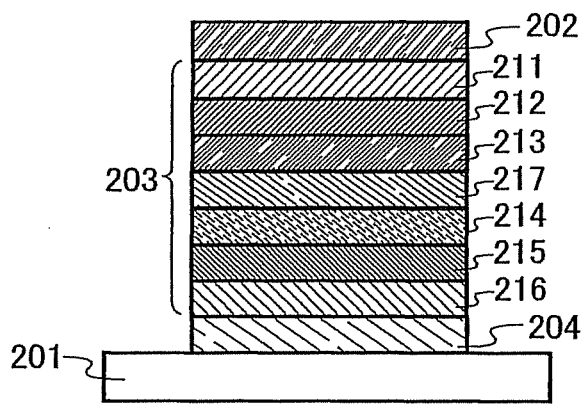

Further, the light-emitting element shown in FIG. 2A has a structure in which the second electrode 204 serving as a cathode, the EL layer 203, and the first electrode 202 serving as an anode are sequentially stacked over the substrate 201. The EL layer 203 has a first layer 211, a second layer 212, a third layer 213, a fourth layer 214, a fifth layer 215, and a sixth layer 216. The fourth layer 214 is provided between the second electrode serving as the cathode and the third layer.

In this embodiment mode, the light-emitting element is manufactured over a substrate made of glass, plastic, or the like. When a plurality of such light-emitting elements are manufactured over one substrate, a passive matrix light-emitting device can be manufactured. Moreover, for example, a thin film transistor (Iii) may be formed over a substrate made of glass, plastic, or the like so that a light-emitting element is manufactured to be electrically connected to the TFT. Thus, an active matrix light-emitting device in which driving of the light-emitting element is controlled by the TFT can be manufactured.

The structure of the TFT is not particularly limited. The TFT may be either a staggered type or an inversely staggered type. In addition, a driver circuit formed over a TFT substrate may be formed using both N-channel TFTs and P-channel TFTs, or using either N-channel TFTs or P-channel TFT. The crystallinity of a semiconductor film used for the TFT is not particularly limited, either. An amorphous semiconductor film may be used, or a crystalline semiconductor film may be used.

The light-emitting element of the present invention has a layer for controlling movement of carriers. Since the layer for controlling movement of carriers includes two or more kinds of substances, carrier balance can be controlled precisely by control of combination, the mixture ratio, the thickness, or the like of the substances. Since the carrier balance can be controlled by control of combination, the mixture ratio, the thickness, or the like of the substances, control of carrier balance can be easier than the conventional technique. That is, even if a physical property of the material itself is not changed, the movement of carriers can be controlled by control of the mixture ratio, the thickness, or the like.

When the carrier balance is controlled using the layer for controlling movement of carriers, the light emission efficiency of the light-emitting element can be improved. With the use of the layer for controlling movement of carriers, excessive injection of electrons into the light-emitting layer and reach of electrons that penetrate the light-emitting layer to a hole transporting layer or a hole injecting layer can be suppressed. When electrons reach the hole transporting layer or the hole injecting layer, probability of recombination of carriers in the light-emitting layer is reduced (in other words, the carrier balance grow undesirable), which leads to reduction in light emission efficiency with time. That is, lifetime of the light-emitting element becomes short.

However, as shown in this embodiment mode, when the layer for controlling movement of carriers is used, excessive injection of electrons into the light-emitting layer and reach of electrons that penetrate the light-emitting layer to the hole transporting layer or the hole injecting layer can be suppressed, and reduction in light emission efficiency with time can be suppressed. That is, a light-emitting element with a long lifetime can be obtained in the present invention. More specifically, movement of carriers is controlled using the second organic compound the proportion of weight of which is lower than the proportion of weight of the first organic compound in the two or more substances included in the layer for controlling movement of carriers. Therefore, the movement of carriers can be controlled by a component the proportion of weight of which is lower in components included in the layer for controlling movement of carriers. As a result, a light-emitting element that hardly deteriorates with time and has a long lifetime can be realized.

That is, change in carrier balance is hardly caused in the light-emitting element as compared with the case where carrier balance is controlled by a single substance. For example, in a case where the movement of carriers is controlled by a layer formed from a single substrate, the carrier balance of the entire layer is changed due to partial change in morphology or partial crystallization. Therefore, the layer for controlling movement of carriers in that case easily deteriorates with time. However, as shown in this embodiment mode, the movement of carriers is controlled by a component the proportion of weight of which is lower in the components included in the layer for controlling movement of carriers, whereby change in morphology or effect of crystallization, aggregation, or the like becomes reduced, and thus deterioration with time is hardly caused. Thus, a light-emitting element with a long lifetime can be obtained in which reduction in light emission efficiency with time is hardly caused.

As shown in this embodiment mode, a structure in which the layer for controlling movement of carriers is provided between the light-emitting layer and the second electrode serving as a cathode is particularly effective when the structure is applied to the light-emitting layer having excessive electrons. For example, in a case where the light-emitting layer has an electron transporting property and there is a possibility in that the ratio in which electrons injected from the second electrode penetrate the light-emitting layer is increased with time, it is particularly effective to apply the structure shown in this embodiment mode.

This embodiment mode can be combined with another embodiment mode as appropriate.

Embodiment Mode 2

In this embodiment mode, a mode of a light-emitting element, which is different from that of Embodiment Mode 1, of the present invention will be explained with reference to FIG. 5A. In this embodiment mode, a light-emitting element provided with a layer for controlling movement of holes as a layer for controlling movement of carriers will be explained. The light-emitting element of the present invention has a plurality of layers between a pair of electrodes. The plurality of layers are stacked by combining of layers including a substance having a high carrier injecting property and a substance having a high carrier transporting property so that a light-emitting region is formed in a portion away from the electrodes, in other words, carriers are recombined in a portion away from the electrodes.

In this embodiment mode, the light-emitting element includes a first electrode 402, a second electrode 404, and an EL layer 403 provided between the first electrode 402 and the second electrode 404. This embodiment mode is explained on the assumption that the first electrode 402 serves as an anode and the second electrode 404 serves as a cathode. That is, this embodiment mode is explained below on the assumption that light emission is obtained when voltage is applied between the first electrode 402 and the second electrode 404 so that the potential of the first electrode 402 is higher than that of the second electrode 404. As a substrate 401, the similar substrate as that of Embodiment Mode 1 can be used.

As the first electrode 402, a metal, an alloy, an electroconductive compound, a mixture thereof, or the like with a high work function (specifically, a work function of 4.0 eV or higher) is preferably used, and the similar material as those shown in Embodiment Mode 1 can be used.

The EL layer 403 has a first layer 411, a second layer 412, a third layer 413, a fourth layer 414, a fifth layer 415, and a sixth layer 416. It is to be noted that any stacked structure is acceptable as long as the EL layer 403 has a layer for controlling movement of carriers shown in this embodiment mode and a light-emitting layer, similarly to Embodiment Mode 1, and a stacked structure of layers other than the above layers is not particularly limited. For example, a hole injecting layer, a hole transporting layer, a light-emitting layer, a layer for controlling movement of carriers, an electron transporting layer, an electron injecting layer, and the like can be combined as appropriate.

The first layer 411 is a layer including a substance having a high hole injecting property, and the similar substance as those shown in Embodiment Mode 1 can be used.

The second layer 412 is a layer including a substance having a high hole transporting property, and the similar substance as those shown in Embodiment Mode 1 can be used.

The third layer 413 is a layer for controlling movement of carriers. The third layer 413 includes two or more kinds of substances. In the third layer 413, the proportion of weight of a first organic compound is greater than the proportion of weight of a second organic compound, and the first organic compound and the second organic compound have transport carriers of different polarity from each other. In this embodiment mode, a case is explained, where the layer for controlling movement of carriers is provided between the first electrode serving as an anode and the light-emitting layer. That is, a case is explained, where the layer for controlling movement of carriers is provided between the fourth layer 414 having a light-emitting function and the first electrode 402.

In the case where the layer for controlling movement of carriers is provided between the first electrode serving as an anode and the light-emitting layer, the first organic compound is preferably an organic compound having hole transporting property, and the second organic compound is preferably an organic compound having electron transporting property. That is, the first organic compound is preferably a substance in which a hole transporting property is higher than an electron transporting property. The second organic compound is preferably a substance in which an electron transporting property is higher than a hole transporting property. Further, the difference between the highest occupied molecular orbital (HOMO level) of the first organic compound and the highest occupied molecular orbital (HOMO level) of the second organic compound is preferably less than 0.3 eV, further preferably, 0.2 eV or less. That is, thermodynamically, it is preferable that holes that are carriers be easily moved between the first organic compound and the second organic compound.

Figure 8:
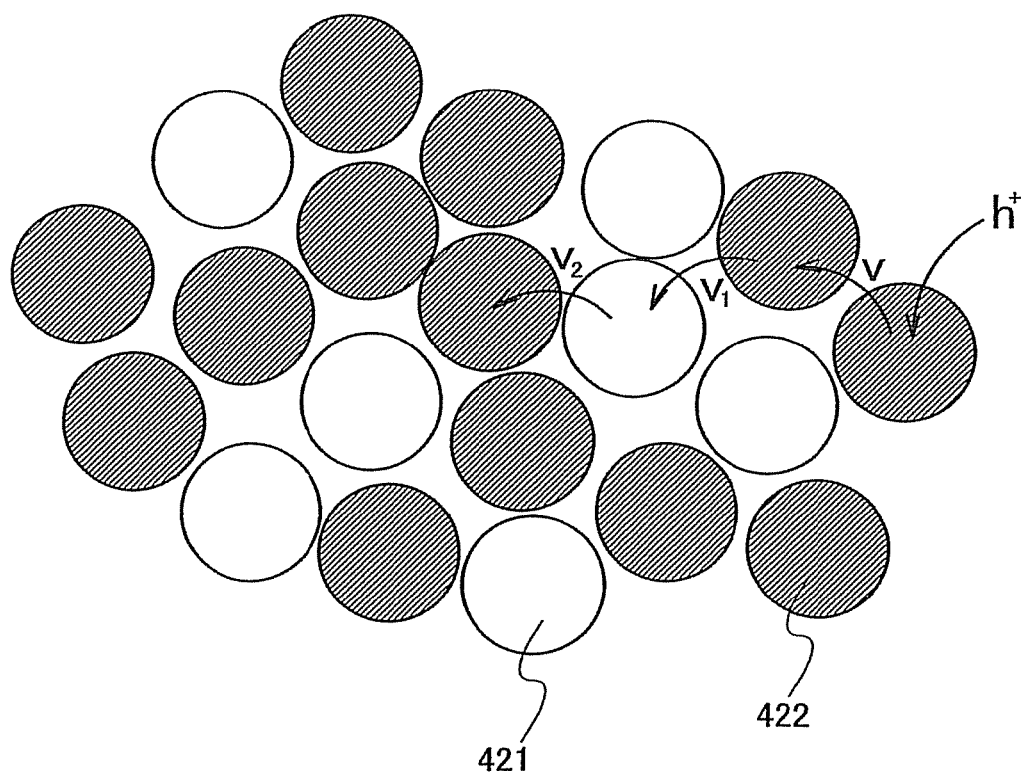
FIG. 8 is a view showing a concept of a layer for controlling movement of carriers in a light-emitting element in Embodiment Mode 2 of the present invention.

FIG. 8 shows a conceptual view of a layer for controlling movement of carriers shown in this embodiment mode. In FIG. 8, since a first organic compound 422 has a hole transporting property, holes are easily injected thereto and moved to near another first organic compound. That is, the rate at which holes are injected to the first organic compound and the rate (v) at which holes are discharged from the first organic compound are large.

On the other hand, since a second organic compound 421, which is an organic compound having electron transporting property, has a HOMO level that is close to the HOMO level of the first organic compound, holes can be thermodynamically injected. However, the rate ($v_1$) at which holes are injected from the first organic compound 422, which is an organic compound having a hole transporting property, to the second organic compound 421, which is an organic compound having an electron transporting property or the rate ($v_2$) at which holes are injected from the second organic compound 421 to the first organic compound 422 is lower than the rate (v) at which holes are injected from the first organic compound 422 to another first organic compound 422.

Therefore, by the inclusion of the second organic compound, a hole transporting rate of the entire layer becomes lower than that of the layer including only the first organic compound 422. That is, by addition of the second organic compound, movement of carriers can be controlled. Further, by control of concentration of the second organic compound, a moving rate of carriers can be controlled.

For example, in a conventional light-emitting element, in which the third layer 413 is not provided, holes are injected to the fourth layer 414 in the state where the rate of holes are not reduced, and the holes reach the vicinity of the interface of the fifth layer 415. Therefore, a light-emitting region is formed in the vicinity of the interface between the fourth layer 414 and the fifth layer 415. In that case, the holes reach the fifth layer 415, and there is a possibility in that the fifth layer 415 is deteriorated. As the quantity of holes reaching the fifth layer 415 is increased with time, probability of recombination is reduced with time; accordingly, reduction in element lifetime (luminance decay with time) is realized.

In the light-emitting element of the present invention, holes injected from the first electrode 402 are injected to the third layer 413, which is a layer for controlling movement of carriers, through the first layer 411 including a substance having a high hole injecting property and the second layer 412 including a substance having a high hole transporting property. Rate of movement of the holes injected to the third layer 413 becomes reduced, and hole injection to the fourth layer 414 is controlled. As a result, in the light-emitting element of the present invention, a light-emitting region is formed in the fourth layer 414 and the vicinity of the interface between the fourth layer 414 and the third layer 413, the element region being formed in the vicinity of the interface between the fifth layer 415 including a substance having a high electron transporting property and the fourth layer 414 in the conventional light-emitting element.

Accordingly, in the light-emitting element of the present invention, the possibility in that the fifth layer 415 including a substance having a high electron transporting property is deteriorated since holes reach the fifth layer 415 is reduced. Further, regarding electrons, since the third layer 413 includes the first organic compound having a hole transporting property, the possibility in that the electrons reach the second layer 412 and the second layer 412 including a substance having a high hole transporting property is deteriorated is reduced.

Furthermore, it is important in the present invention that a substance of which hole mobility is low is not just applied, but an organic compound having electron transporting property is added to the organic compound having hole transporting property in the third layer 413. When such a structure is employed, in addition to just controlling hole injection to the fourth layer 414, change of the quantity of controlled hole injection with time can be suppressed. According to the above, in the light-emitting element of the present invention, a phenomenon in which carrier balance is deteriorated with time and probability of recombination is reduced can be prevented; therefore, improvement in element lifetime (suppression of luminance decay with time) is realized.

In the light-emitting element of the present invention, since a light-emitting region is not formed at an interface between the light-emitting layer and the hole transporting layer or at an interface between the light-emitting layer and the electron transporting layer, the light-emitting element is not affected by deterioration due to proximity of the light-emitting region to the hole transporting layer or the electron transporting layer. In addition, change in carrier balance with time (particularly, change of the quantity of electron injection with time) can be suppressed. Accordingly, a light-emitting element having little deterioration and a long lifetime can be obtained.

As described above, the first organic compound is preferably an organic compound having a hole transporting property in this embodiment mode. Specifically, the following can be used: condensed aromatic hydrocarbons such as DPAnth and 6,12-dimethoxy-5,11-diphenycrysene; or aromatic amine compounds such as CzA1PA, DPhPA, PCAPA, PCAPBA, 2PCAPA, NPB (or α-NPD), DFLDPBi, and BSPB. Furtherer, high molecular compounds such as PVK, PVTPA, PTPDMA, and Poly-TPD can be used.

The second organic compound is preferably an organic compound having an electron transporting property. Specifically, the following can be used: metal complexes such as Alq, Almq$_3$, BeBq$_2$, Znq, ZnPBO, and ZnBTZ; heterocyclic compounds such as PBD, OXD-7, TAZ, BPhen, and BCP; or condensed aromatics compounds such as CzPA, DPCzPA, DPPA, DNA, t-BuDNA, BANT, DPNS, DPNS2, and TPB3. In addition, high molecular compounds can be used, such as poly[(9,9-dihexylfluorene-2,7-diyl)-co-(pyridine-3,5-diyl)] (abbreviation: PF-Py) and poly[(9,9-dioctylfluorene-2,7-diyl)-co-(2,2'-bipyridine-6,6'-diyl)] (abbreviation: PF-BPy).

By the above combination, movement of holes from the first organic compound to the second organic compound or movement of holes from the second organic compound to the first organic compound is suppressed, and then, the rate of movement of holes in a layer for controlling movement of carriers can be suppressed. The layer for controlling movement of carriers is formed, in which the second organic compound is dispersed into the first organic compound; therefore, crystallization or aggregation is hardly caused with time. Accordingly, the above-described suppression effect of movement of holes is hardly changed with time, and as a result, carrier balance is hardly changed with time. This leads to improvement in a lifetime of the light-emitting element, in other words, improvement in reliability.

It is to be noted that, in the above combination, an aromatic amine compound as the first organic compound and a metal complex as the second organic compound are preferably combined. An aromatic amine compound has a high hole transporting property and comparatively small dipole moment, whereas, a metal complex has a high electron transporting property and large dipole moment. In such a manner, by combination of substances dipole moment of which is largely different from each other, the above suppression effect of movement of holes becomes further significant. Specifically, when the magnitude of the dipole moment of the first organic compound is $P_1$ and the magnitude of the dipole moment of the second organic compound is $P_2$, a combination of $P_1/P_2 \geq 3$ or $P_1/P_2 \leq 0.33$ is preferably satisfied. For example, the dipole moment of NPB, which is an aromatic amine compound, is 0.86 debye, and the dipole moment of Alq, which is a metal complex, shows 9.40 debye. Accordingly, when an organic compound having a hole transporting property like an aromatic amine compound is used as the first organic compound and an organic compound having an electron transporting property like a metal complex is used as the second organic compound, $P_1/P_2 \leq 0.33$ is preferably satisfied.

The emission color of the second organic compound included in the third layer 413 and the emission color of a substance having a high light-emitting property included in the fourth layer 414 are preferably similar colors. Specifically, the difference between the wavelength of the highest peak of the emission spectrum of the second organic compound and the wavelength of the highest peak of the emission spectrum of the substance having a high light-emitting property is preferably within 30 nm. When the difference is within 30 nm, the emission color of the second organic compound and the emission color of the substance having light-emitting property can be similar colors. Accordingly, even in a case where the second organic compound emits light due to change of voltage or the like, change in emission color can be suppressed. However, the second organic compound has no necessity to emit light.

Further, a thickness of the third layer 413 is preferably greater than or equal to 5 nm and less than or equal to 20 nm. When the third layer 413 is too thick, the rate of movement of carries is excessively reduced, and a driving voltage is increased. In addition, emission intensity of the third layer may be increased. Alternatively, when the third layer 413 is too thin, the function of controlling movement of carriers is not realized. Therefore, the thickness is preferably greater than or equal to 5 nm and less than or equal to 20 nm.

The fourth layer 414 is a layer including a substance having a high light-emitting property, in other words, the light-emitting layer, and the substance having a high light-emitting property shown in Embodiment Mode 1 can be used for the fourth layer 414. Further, the light-emitting layer may have a structure in which the substance having a high light-emitting property is dispersed into another substance as shown in Embodiment Mode 1.

In this embodiment mode, since the layer for controlling movement of carriers is provided between the light-emitting layer and the first electrode serving as an anode, the light-emitting layer has preferably a hole transporting property. That is, it is preferable that a hole transporting property be higher than an electron transporting property. In the case where the light-emitting layer has a hole transporting property, a hole blocking layer was conventionally provided between a cathode and the light-emitting layer so as to prevent holes from penetrating the light-emitting layer. However, when the hole blocking function is deteriorated with time, a recombination region is extended to the inside of the hole blocking layer (or the inside of an electron transporting layer), and thus reduction in current efficiency (in other words, luminance decay) becomes significant. On the other hand, in the present invention, since movement of holes is controlled between an anode and the light-emitting layer (an anode side), even if the balance of the holes (e.g., mobility or number of electrons relative to those of holes) is more or less lost, the ratio of carriers recombined in the light-emitting layer is hardly changed, and there is an advantage in that luminance is hardly lowered.

Therefore, as a material for dispersing a substance having high light-emitting property shown in Embodiment Mode 1, an organic compound having hole transporting property is preferable. Specifically, the following can be used: condensed aromatic hydrocarbons such as DPAnth and 6,12-dimethoxy-5,11-diphenycrysene; or aromatic amine compounds such as CzA1PA, DPhPA, PCAPA, PCAPBA, 2PCAPA, NPB (or α-NPD), TPD, DFLDPBi, and BSPB.

The fifth layer 415 is a layer including a substance having a high electron transporting property, and similar substances as those shown in Embodiment Mode 1 can be used for the fifth layer 415.

The sixth layer 416 is a layer including a substance having a high electron injecting property, and similar substances as those shown in Embodiment Mode 1 can be used for the sixth layer 416.

Various methods can be used for forming the EL layer, regardless of a dry method or a wet method. For example, vacuum evaporation, inkjet, spin coating, or the like may be used. Furthermore, electrodes or layers may be formed by different film formation methods. For example, the EL layer may be formed by a wet method using a high molecular compound in the above-described materials. Alternatively, the EL layer can be formed by a wet method using a low molecular organic compound. Furthermore, the EL layer may be formed by a dry method such as vacuum evaporation using a low molecular organic compound.

The electrode may be formed by a wet method using a sol-gel method, or by a wet method using paste of a metal material. Further, the electrode may be formed by a dry method such as sputtering or vacuum evaporation.

Hereinafter, specific methods of forming a light-emitting element are described. In the case where the light-emitting element of the present invention is applied to a display device and light-emitting layers are formed by separately applying mixture including a material for the light-emitting layers, the light-emitting layers are preferably formed by a wet method.

When the light-emitting layers are formed using inkjet, it becomes easy to form light-emitting layers by separately applying mixture including a material for the light-emitting layer seven on a large-sized substrate.

Figure 5A:
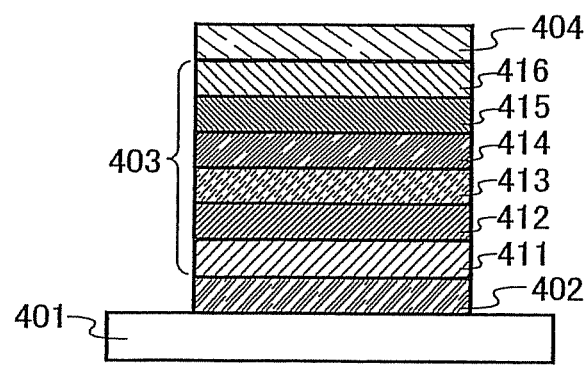
FIGS. 5A and 5B are views showing a light-emitting element in Embodiment Mode 1 of the present invention.
Figure 5B:
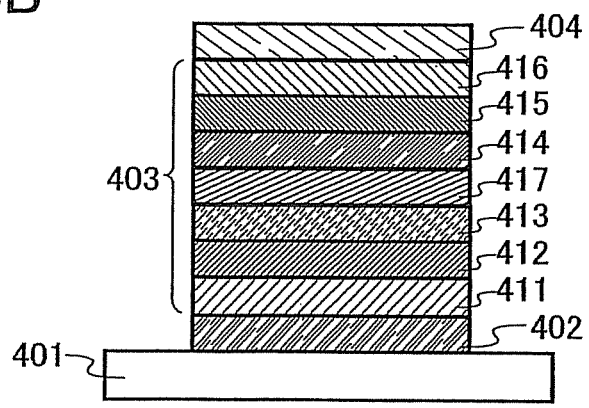

For example, in the structures shown in FIGS. 5A and 5B, the first electrode may be formed by sputtering, which is a dry method, the first layer may be formed by inkjet or spin coating, which is a wet method, the second layer may be formed by vacuum evaporation which is a dry method, the third layer may be formed by inkjet, which is a wet method, the fourth layer may be formed by co-evaporation, which is a dry method, the fifth layer and the sixth layer may be formed by vacuum evaporation, which is a dry method, and the second electrode may be formed by inkjet or spin coating, which is a wet method. Alternatively, the first electrode may be formed by inkjet, which is a wet method, the first layer may be formed by vacuum evaporation, which is a dry method, the second layer may be formed by inkjet or spin coating, which is a wet method, the third layer may be formed by inkjet, which is a wet method, the fourth layer may be formed by inkjet or spin coating, which is a wet method, the fifth layer and the sixth layer may be formed by inkjet or spin coating, which is a wet method, and the second electrode may be formed by inkjet or spin coating. The method for forming the light-emitting element is not limited to the above methods, and a wet method and a dry method may be combined as appropriate.

For example, specifically, in the case of the structures shown in FIGS. 5A and 5B, the first electrode can be formed by sputtering, which is a dry method, the first layer and the second layer can be formed by vacuum evaporation, which is a dry method, the third layer can be formed by co-evaporation, which is a dry method, the fourth layer that is a light-emitting layer can be formed by inkjet, which is a wet method, the fifth layer can be formed by inkjet or spin coating, which is a wet method, and the second electrode can be formed by inkjet or spin coating, which is a wet method without providing the sixth layer. That is, the first electrode to the third layer can be formed by dry methods, and the fourth layer to the second electrode can be formed by wet methods. By this method, the first electrode to the third layer can be consecutively formed in a vacuum, and the fourth layer to the second electrode can be formed under an atmospheric pressure. Further, it is easy to form the fourth layers by separately applying mixture including a material for the fourth layers. Therefore, the steps can be simplified, and productivity can be improved.

Further, in the case of the structure shown in FIGS. 6A and 6B, a light-emitting element can be formed in a reverse order of the above method as follows: the second electrode can be formed by inkjet or spin coating, which is a wet method; the sixth layer and the fifth layer can be formed by inkjet or spin coating, which is a wet method; the fourth layer can be formed by inkjet, which is a wet method; the third layer can be formed by co-evaporation, which is a dry method; the second layer and the first layer can be formed by vacuum evaporation, which is a dry method; and the first electrode can be formed by vacuum evaporation, which is a dry method. By this method, the second electrode to the fourth layer can be formed in an atmospheric pressure, and the third layer to the first electrode can be consecutively formed under a vacuum by a dry method. Therefore, the steps can be simplified, and productivity can be improved.

In the light-emitting element having the above structure of the present invention, current flows owing to a potential difference caused between the first electrode 402 and the second electrode 404, and holes and electrons are recombined in the EL layer 403, whereby the light-emitting element emits light. Light emission is extracted to the outside through one of or both the first electrode 402 and the second electrode 404. Accordingly, one of or both the first electrode 402 and the second electrode 404 are an electrode having a transmitting property.

Figure 7A:
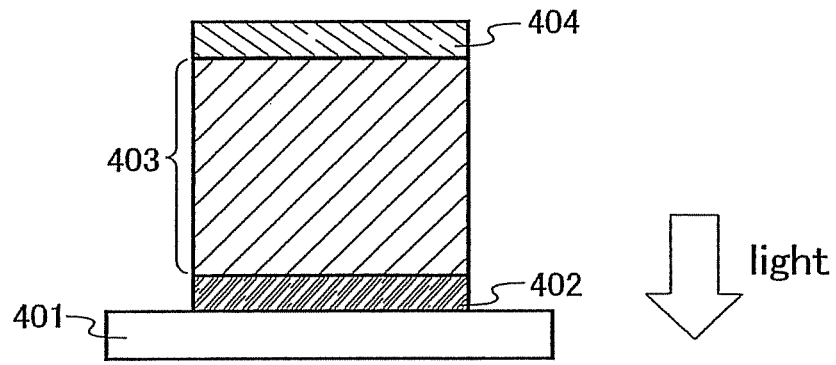
FIGS. 7A to 7C are views showing a light emission mode of a light-emitting element in Embodiment Mode 2 of the present invention.
Figure 7B:
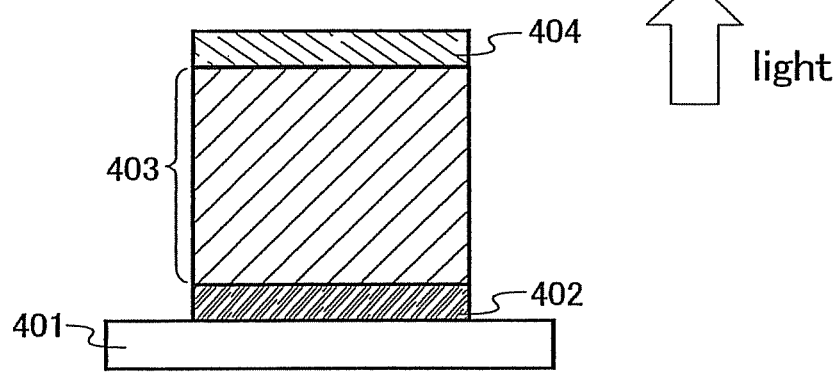
Figure 7C:
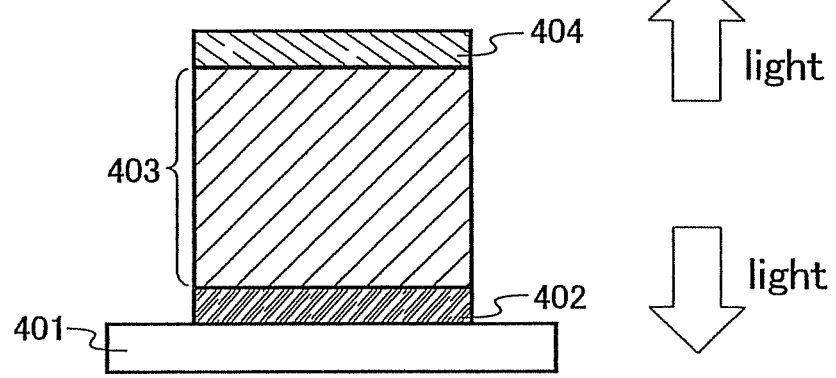

When only the first electrode 402 has light transmitting property, light emission is extracted from the substrate side through the first electrode 402 as shown in FIG. 7A. When only the second electrode 404 has light transmitting property, light emission is extracted from the opposite side of the substrate through the second electrode 404 as shown in FIG. 7B. When both the first electrode 402 and the second electrode 404 have light transmitting property, light emission is extracted from both the substrate side and the opposite side of the substrate through the first electrode 402 and the second electrode 404 as shown in FIG. 7C.

The structure of the layer provided between the first electrode 402 and the second electrode 404 is not limited to the above structure. That is, in the present invention and this embodiment mode, the structure other than the above may be employed as long as a light-emitting region in which holes and electrons are recombined is provided in a portion away from the first electrode 402 and the second electrode 404 in order to prevent quenching caused by proximity of the light-emitting region and a metal, and a layer for controlling movement of carriers is provided.

That is, the stacked structure of the EL layer is not particularly limited. The EL layer may be formed by appropriate combination of layers each including a substance having a high electron transporting property, a substance having a high hole transporting property, a substance having a high electron injecting property, a substance having a high hole injecting property, a substance having a bipolar property (a substance having a high electron and hole transporting properties), or the like; a layer for controlling movement of carriers shown in this embodiment mode; and a light-emitting layer.

It is to be noted that, since the layer for controlling movement of carriers shown in this embodiment mode is a layer for controlling movement of holes, the layer for controlling movement of carriers is preferably provided between the electrode serving as an anode and the light-emitting layer. For example, as shown in FIG. 5B, a seventh layer 417 including a substance having a high hole transporting property may be provided between the fourth layer 414 having light-emitting function and the third layer 413, which is a layer for controlling movement of carriers.

Further preferably, the layer for controlling movement of carriers is preferably provided so as to be in contact with the light-emitting layer. When the layer for controlling movement of carriers is provided so as to be in contact with the light-emitting layer, hole injection to the light-emitting layer can be directly controlled. Therefore, change in carrier balance with time can be further suppressed in the light-emitting element, and further improvement in element lifetime can be obtained. In addition, the seventh layer 217 including a substance having a high hole transporting property does not need to be provided, whereby the process becomes simple.

In the case where the layer for controlling movement of carriers is provided so as to be in contact with the light-emitting layer, the structures of the first organic compound included in the layer for controlling movement of carriers and an organic compound occupying large part of the light-emitting layer are preferably different from each other. In particular, in the case where the light-emitting layer includes a substance for dispersing a substance having a high light-emitting property (a third organic compound) and a substance having a high light-emitting property (a fourth organic compound), the structures of the third organic compound and the first organic compound are preferably different from each other. In such a structure, movement of carriers (movement of holes in this embodiment mode) from the layer for controlling movement of carriers to the light-emitting layer is suppressed also between the first organic compound and the third organic compound, and the effect of providing the layer for controlling movement of carriers is further increased.

Figure 6A:
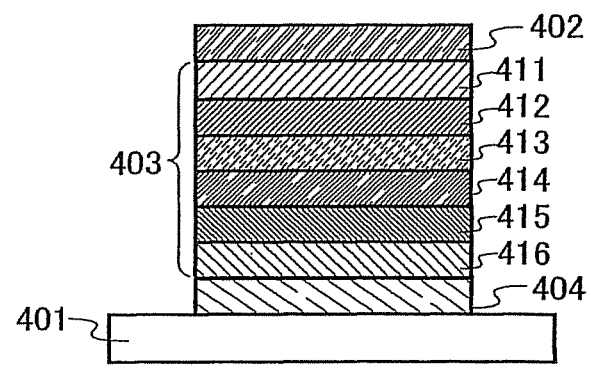
FIGS. 6A and 6B are views showing a light-emitting element that has a different stacked structure from that of FIGS. 5A and 5B in Embodiment Mode 2 of the present invention.
Figure 6B:
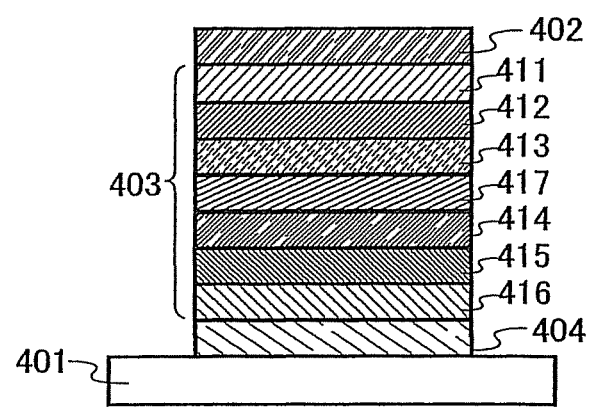

The light-emitting element shown in FIGS. 6A and 6B includes, over a substrate 401, a second electrode 404 serving as a cathode, an EL layer 403, and a first electrode 402 serving as an anode are sequentially stacked. The EL layer 403 has a first layer 411, a second layer 412, a third layer 413, a fourth layer 414, a fifth layer 415, and a sixth layer 416. The third layer 413 is provided between the first electrode serving as an anode and the fourth layer 414.

The light-emitting element of the present invention has a layer for controlling movement of carriers. Since the layer for controlling movement of carriers includes two or more kinds of substances, carrier balance can be controlled precisely by control of combination, the mixture ratio, the thickness, or the like of the substances. Since the carrier balance can be controlled by control of combination, the mixture ratio, the thickness, or the like of the substances, control of carrier balance can be easier than the conventional technique. That is, even if a physical property of the material itself is not changed, the movement of carriers can be controlled by control of the mixture ratio, the thickness, or the like. The carrier balance is improved using the layer for controlling movement of carriers, whereby light emission efficiency of the light-emitting element can be improved.

With the use of the layer for controlling movement of carriers, excessive injection of holes and reach of holes that penetrate the light-emitting layer to an electron transporting layer or an electron injecting layer can be suppressed. When holes reach the electron transporting layer or the electron injecting layer, probability of recombination in the light-emitting layer is reduced (in other words, the carrier balance is lost), which leads to reduction in light emission efficiency with time. That is, lifetime of the light-emitting element becomes short. However, as shown in this embodiment mode, when the layer for controlling movement of carriers is used, excessive injection of holes and reach of holes that penetrate the light-emitting layer to the electron transporting layer or the electron injecting layer can be suppressed, and reduction in light emission efficiency with time can be suppressed. That is, a light-emitting element with long lifetime can be obtained.

Movement of carriers is controlled using the second organic compound the proportion of weight of which is lower than the proportion of weight of the first organic compound in the two or more kinds of substances included in the layer for controlling movement of carriers. Therefore, since movement of carriers can be controlled by a component the proportion of weight of which is lower in components included in the layer for controlling movement of carriers, long lifetime of the light-emitting element that hardly deteriorates with time can be realized. That is, change in carrier balance is hardly caused as compared with the case where carrier balance is controlled by a single substance.

For example, in the case where movement of carriers is controlled by a layer formed from a single substance, the balance of the entire layer is changed due to partial change in morphology or partial crystallization. Therefore, the layer for controlling movement of carriers in that case easily deteriorates with time. However, as shown in this embodiment mode, the movement of carriers is controlled by a component the proportion of weight of which is lower in the components included in the layer for controlling movement of carriers, whereby change in morphology or effect of crystallization, aggregation, or the like is reduced, and then change with time is hardly caused. Thus, a light-emitting element with a long lifetime, in which reduction in light emission efficiency with time is hardly caused, can be obtained.

As shown in this embodiment mode, a structure in which the layer for controlling movement of carriers is provided between the light-emitting layer and the first electrode serving as an anode is particularly effective when the structure is applied to the light-emitting layer having excessive holes. For example, in the case where the light-emitting layer has a hole transporting property, and in the case where there is a possibility in that the ratio in which holes injected from the first electrode penetrate the light-emitting layer is increased with time, it is particularly effective that the structure shown in this embodiment mode is applied.

This embodiment mode can be combined with another embodiment mode as appropriate. For example, a layer for controlling movement of holes may be provided between a light-emitting layer and a first electrode serving as an anode, and a layer for controlling movement of electrons may be provided between the light-emitting layer and a second electrode serving as a cathode. That is, by such a structure, layers for controlling movement of carriers can be provided on both sides of the light-emitting layer. Then, carriers are recombined in portions separated from the electrodes, the portions being on both sides of the light-emitting layer, which is preferable. As a result, by control of the movement of carriers on both sides of the light-emitting layer, change in morphology or effect of crystallization, aggregation, or the like is further reduced. Accordingly, a light emitting layer having a long lifetime can be obtained, in which change with time is hardly caused and reduction in light emission efficiency with time is hardly caused.

Embodiment Mode 3

In this embodiment mode, a mode of a light-emitting element in which a plurality of light-emitting units of the present invention are stacked (hereinafter, this light-emitting element is referred to as a stacked-type element) will be explained with reference to FIG. 9. The light-emitting element is a stacked-type light-emitting element including a plurality of light-emitting units between a first electrode and a second electrode. Each of the light-emitting units may have a similar structure to that of the EL layer shown in Embodiment Mode 1 and Embodiment Mode 2. That is, the light-emitting elements shown in Embodiment Mode 1 and Embodiment Mode 2 are each a light-emitting element having one light-emitting unit, whereas the light-emitting element explained in this embodiment mode has a plurality of light-emitting units.

Figure 9:
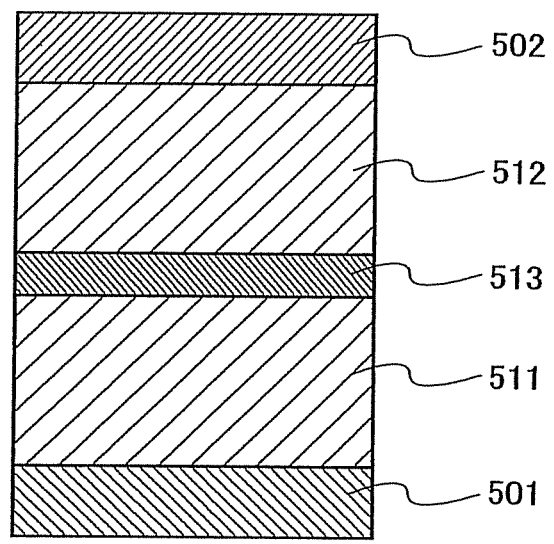
FIG. 9 is a view showing a light-emitting element in which a plurality of light-emitting units are stacked in Embodiment mode 3 of the present invention.

In FIG. 9, a first light-emitting unit 511 and a second light-emitting unit 512 are stacked between a first electrode 501 and a second electrode 502. The first electrode 501 and the second electrode 502 may be similar to the electrodes shown in Embodiment Mode 1. The first light-emitting unit 511 and the second light-emitting unit 512 may have, either the same structure or a different structure, which may be similar to those shown in Embodiment Mode 1 and Embodiment Mode 2.

A charge generating layer 513 includes a composite material of an organic compound and a metal oxide. The composite material of an organic compound and a metal oxide is the composite material shown in Embodiment Mode 1 and includes the organic compound and a metal oxide such as vanadium oxide, molybdenum oxide, or tungsten oxide. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound that has a hole transporting property and has hole mobility of $10^{-6}$ cm$^2$/Vs or higher. However, other substances than these may also be used as long as the hole transporting property is higher than the electron transporting property. The composite material of the organic compound and the metal oxide can realize low-voltage driving and low-current driving because of a superior carrier injecting property and carrier transporting property.

Alternatively, the charge generating layer 513 may be formed by combination of a layer including the composite material of the organic compound and the metal oxide with a layer formed using another material. For example, a layer including the composite material of the organic compound and the metal oxide may be combined with a layer including a compound selected from substances with electron-donating properties and a compound having a high electron transporting property. Moreover, a layer including the composite material of the organic compound and the metal oxide may be combined with a transparent conductive film.

In any case, it is acceptable as long as the charge generating layer 513 interposed between the first light-emitting unit 511 and the second light-emitting unit 512 injects electrons into one of these light-emitting units and holes to the other when a voltage is applied to the first electrode 501 and the second electrode 502. For example, in FIG. 9, it is acceptable as long as the charge generating layer 513 injects electrons into the first light-emitting unit 511 and holes to the second light-emitting unit 512 in a case where a voltage is applied so that potential of the first electrode is higher than that of the second electrode.

This embodiment mode explains the light-emitting element having two light-emitting units. However, the present invention can be similarly applied to a light-emitting element in which three or more light-emitting units are stacked. When the charge generating layer is provided between the pair of electrodes so as to partition the plurality of light-emitting units like the light-emitting element of this embodiment mode, a long lifetime element in a high luminance region can be realized while keeping current density low. When the light-emitting element is applied for lighting, voltage drop due to resistance of an electrode material can be reduced, thereby achieving homogeneous light emission in a large area. Moreover, a light-emitting device of low power consumption, which can be driven at a low voltage, can be realized.

When light-emitting units have different emission colors, light emission of desired color can be obtained as a whole light-emitting element. For example, in the light-emitting element having two light-emitting units, when emission color of the first light-emitting unit and emission color of the second light-emitting unit are complementary colors, a light-emitting element emitting white light as a whole light-emitting element can be obtained. It is to be noted that "complementary color" refers to a relation between colors which become achromatic color by being mixed. That is, white light emission can be obtained by mixture of light obtained from substances emitting the light of complementary colors. Similarly, also in a light-emitting element including three light-emitting units, white light emission can be similarly obtained as a whole light-emitting element in a case where emission color of a first light-emitting unit is red, emission color of a second light-emitting unit is green, and emission color of a third light-emitting unit is blue, for example.

This embodiment mode can be combined with another embodiment mode as appropriate.

Embodiment Mode 4

In this embodiment mode, a light-emitting device that has a light-emitting element of the present invention will be explained. In this embodiment mode, a light-emitting device that has a light-emitting element of the present invention in a pixel portion will be explained with reference to FIG. 10A and FIG. 10B. FIG. 10A is a top view showing a light-emitting device, and FIG. 10B is a cross-sectional view taken along a line A-A' and a line B-B' in FIG. 10A.

In FIG. 10A, reference numeral 601 denotes a driver circuit portion (source driver circuit), 602 denotes a pixel portion, and 603 denotes a driver circuit portion (gate driver circuit), each of which is shown by a dotted line. Reference numeral 604 denotes a sealing substrate, 605 denotes a sealing member, and 607 denotes a space surrounded by the sealing member 605. A lead wiring 608 is a wiring for transmitting signals to be input to the source driver circuit 601 and the gate driver circuit 603, and receives a video signal, a clock signal, a start signal, a reset signal, and the like from an FPC (Flexible Printed Circuit) 609 that is an external input terminal. Although only the FPC is shown here, a printed wiring board (PWB) may be attached to the FPC. The light-emitting device in this specification includes not only the light-emitting device itself, but also a state where the FPC or the PWB is attached to the light-emitting device.

Next, the cross-sectional structure is explained with reference to FIG. 10B. Although the driver circuit portion and the pixel portion are formed over an element substrate 610, FIG. 10B shows the source driver circuit 601 that is the driver circuit portion and one pixel in the pixel portion 602. The source driver circuit 601 includes a CMOS circuit formed by combining an N-channel TFT 623 and a P-channel TFT 624. Alternatively, the driver circuit may be formed using a CMOS circuit, a PMOS circuit, or an NMOS circuit. In this embodiment mode, the integrated driver circuit that is formed over the substrate is shown; however, the driver circuit is not necessarily formed over the substrate and may be formed outside the substrate.

The pixel portion 602 includes a plurality of pixels each having a switching TFT 611, a current controlling TFT 612, and a first electrode 613 that is electrically connected to a drain of the current controlling TFT 612. An insulator 614 is formed to cover an edge portion of the first electrode 613. Here, the insulator 614 is formed using a positive photosensitive acrylic resin film.

In order to improve coverage, an upper edge portion or a lower edge portion of the insulator 614 is formed so as to have a curved surface with curvature. For example, when positive photosensitive acrylic is used for the insulator 614, it is preferable that only the upper edge portion of the insulator 614 have a curved surface with a radius of curvature of 0.2 to 3 µm. Either a negative type that becomes insoluble in an etchant by light irradiation or a positive type that becomes soluble in an etchant by light irradiation can be used as the insulator 614.

An EL layer 616 and a second electrode 617 are formed over the first electrode 613. As a material used for the first electrode 613, various metals, alloys, electroconductive compounds, or a mixture thereof can be used. When the first electrode is used as an anode, it is preferable to use, among those materials, a metal, an alloy, an electroconductive compound, a mixture thereof, or the like with a high work function (work function of 4.0 eV or higher). For example, it is possible to use a single layer film of an indium oxide-tin oxide film containing silicon, an indium oxide-zinc oxide film, a titanium nitride film, a chromium film, a tungsten film, a zinc film, a platinum film, or the like. It is also possible to use a stacked film such as a stack of a film containing titanium nitride and a film mainly containing aluminum or a three-layer structure of a titanium nitride film, a film mainly containing aluminum, and a titanium nitride film. With the stacked structure, a low wiring resistance, favorable ohmic contact, and a function as an anode can be achieved.

The EL layer 616 is formed by various methods such as an evaporation method using an evaporation mask, an inkjet method, and a spin coating method. The EL layer 616 includes the layer for controlling movement of carriers and the light-emitting layer shown in Embodiment Modes 1 and 2. As another material included in the EL layer 616, a low molecular compound or a high molecular compound (including oligomer or dendrimer) may be used. As the material for the EL layer, not only an organic compound but also an inorganic compound may be used.

As a material used for the second electrode 617, various metals, alloys, electroconductive compounds, or a mixture thereof can be used. When the second electrode is used as a cathode, it is preferable to use, among those materials, a metal, an alloy, an electroconductive compound, a mixture thereof, or the like with a low work function (a work function of 3.8 eV or lower). For example, an element that belongs to Group 1 or 2 of the periodic table, that is, an alkali metal such as lithium (Li) or cesium (Cs), an alkaline earth metal such as magnesium (Mg), calcium (Ca), or strontium (Sr), an alloy containing these (magnesium-silver, aluminum-lithium), or the like can be given. When light generated in the EL layer 616 is transmitted through the second electrode 617, the second electrode 617 can be formed using a stack of a metal thin film and a transparent conductive film (indium oxide-tin oxide (ITO), indium oxide-tin oxide containing silicon or silicon oxide, indium oxide-zinc oxide (IZO), indium oxide containing tungsten oxide and zinc oxide (IWZO), or the like).

When the sealing substrate 604 and the element substrate 610 are attached to each other with the sealing member 605, a light-emitting element 618 is provided in the space 607 surrounded by the element substrate 610, the sealing substrate 604, and the sealing member 605. The space 607 may be filled with filler, and may be filled with an inert gas (such as nitrogen and argon), the sealing member 605, or the like.

An epoxy-based resin is preferably used for the sealing member 605. The material preferably allows as little moisture and oxygen as possible to penetrate. As a material for the sealing substrate 604, a plastic substrate made of FRP (Fiberglass-Reinforced Plastics), PVF (polyvinyl fluoride), polyester, acrylic, or the like can be used besides a glass substrate or a quartz substrate.

As described-above, the light-emitting device that has a light-emitting element of the present invention can be obtained. The thus obtained light-emitting device of the present invention has a light-emitting element with a long lifetime; therefore, the light-emitting device has a long lifetime. In addition, the light-emitting device of the present invention has a light-emitting element with high light emission efficiency; therefore, a light-emitting device with reduced power consumption, which can emit light with high luminance, can be obtained.

Figure 11A:
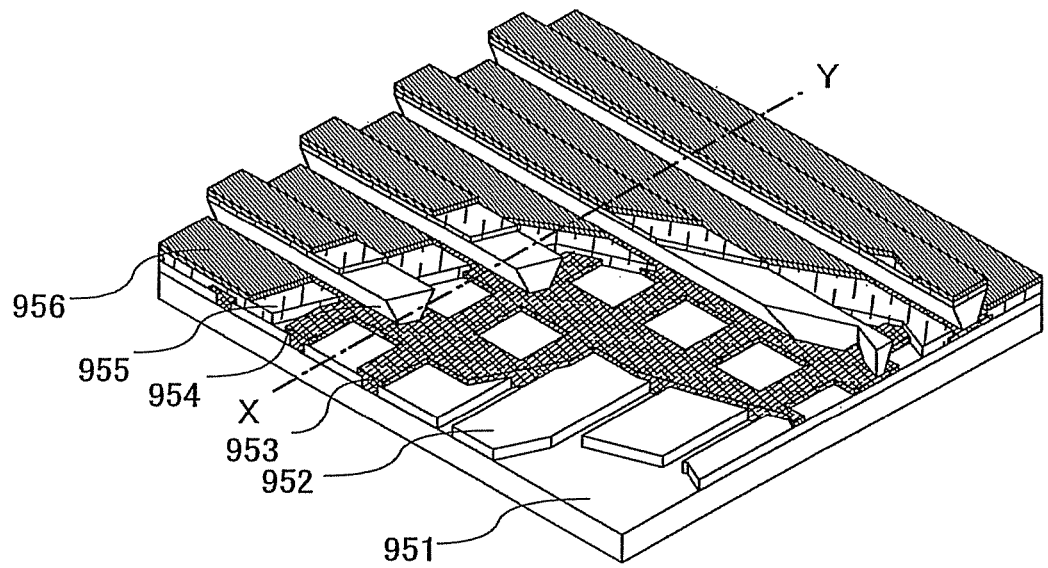
FIGS. 11A and 11B are views showing a passive matrix light-emitting device in Embodiment Mode 4 of the present invention.
Figure 11B:
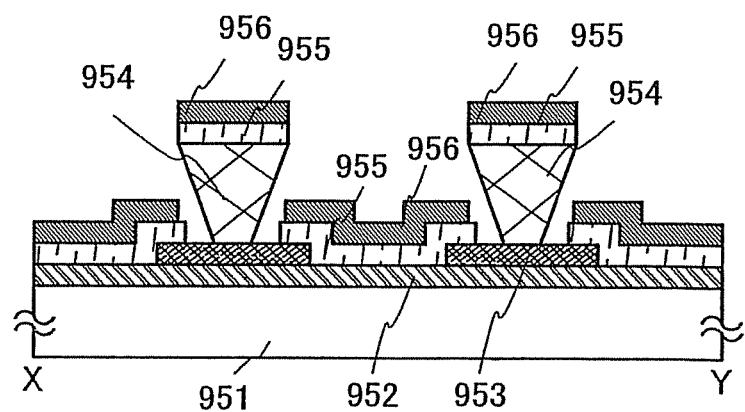

As described above, in this embodiment mode, an active matrix light-emitting device in which operation of a light-emitting element is controlled by a transistor is explained. Alternatively, a passive matrix light-emitting device may also be used, which operates the light-emitting element without providing elements for driving such as a transistor, and a structure of that case is shown in FIGS. 11A and 11B. FIGS. 11A and 11B respectively show a perspective view and a cross-sectional view of a passive matrix light-emitting device which is manufactured by application of the present invention. It is to be noted that FIG. 11A is a perspective view showing a light-emitting device, and FIG. 11B is a cross-sectional view taken along a line X-Y in FIGS. 11A and 11B. In FIG. 11A, an EL layer 955 is provided between an electrode 952 and an electrode 956 over a substrate 951. An edge portion of the electrode 952 is covered with an insulating layer 953. Further, a partition layer 954 is provided over the insulating layer 953. A side wall of the partition layer 954 slopes so that a distance between one side wall and the other side wall becomes narrow toward a substrate surface. In other words, a cross section of the partition layer 954 in the direction of a short side is trapezoidal, and a base (a side facing in the same direction as a plane direction of the insulating layer 953 and in contact with the insulating layer 953) is shorter than an upper side (a side facing in the same direction as the plane direction of the insulating layer 953 and not in contact with the insulating layer 953). By the partition layer 954 being provided in this manner, defects of the light-emitting element due to static electricity or the like can be prevented. Also in the passive matrix light-emitting device, by the long-lifetime light-emitting element of the present invention being included, a long-lifetime light-emitting device can be obtained. Further, by the light-emitting element of the present invention with high light emission efficiency being included, a light-emitting device with reduced low power consumption can be obtained.

Embodiment Mode 5

In this embodiment mode, an electronic device of the present invention, which includes the light-emitting device shown in Embodiment Mode 4 as part thereof, will be explained. An electronic device of the present invention has a light-emitting element shown in Embodiment Modes 1 to 3 and a display portion with a long lifetime. Further, since the light-emitting element has high light emission efficiency, a display portion with reduced low power consumption can be obtained.

Examples of the electronic device manufactured by using the light-emitting device of the present invention are as follows: a camera such as a video camera or a digital camera, a goggle type display, a navigation system, a sound reproducing device (a car audio system, an audio component, or the like), a computer, a game machine, a portable information terminal (a mobile computer, a mobile phone, a mobile game machine, an electronic book, or the like), an image reproducing device provided with a recording medium (specifically, a device for reproducing a recording medium such as a digital versatile disc (DVD) and having a display device for displaying the image), and the like. FIGS. 12A to 12D show specific examples of these electronic devices.

Figure 12A:
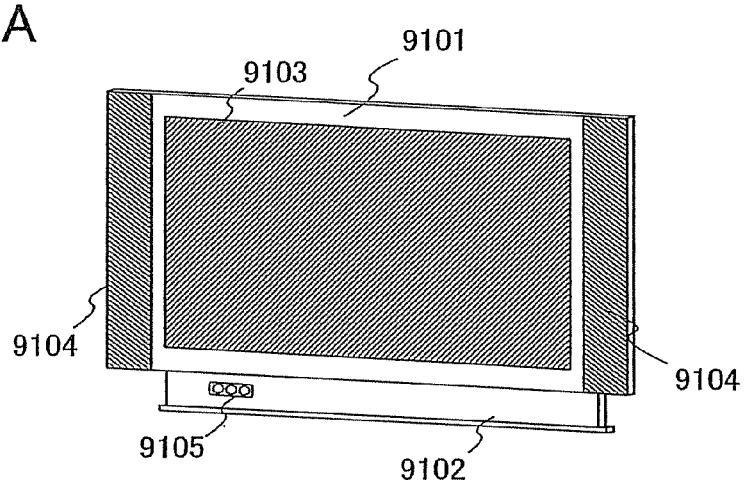
FIGS. 12A to 12D are views illustrating electronic devices of the present invention.

FIG. 12A shows a television device according to the present invention, which includes a chassis 9101, a support base 9102, a display portion 9103, a speaker portion 9104, a video input terminal 9105, and the like. In this television device, the display portion 9103 includes light-emitting elements similar to those explained in Embodiment Modes 1 to 3, which are arranged in matrix. The light-emitting element has a feature that the lifetime is long. Since the display portion 9103 including the light-emitting element also has the similar feature, this television device has a feature that the lifetime is long. That is, a television device that can withstand long-time use can be provided. Further, since a light-emitting element has high light emission efficiency, a television device having a display portion of which power consumption is reduced can be obtained.

Figure 12B:
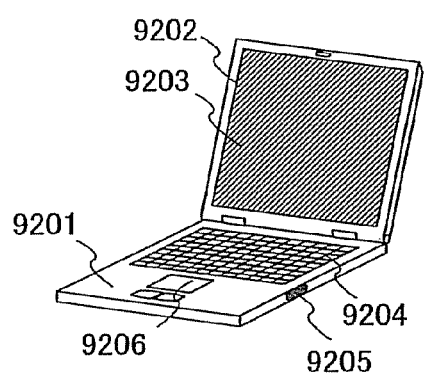

FIG. 12B shows a computer according to the present invention, which includes a main body 9201, a chassis 9202, a display portion 9203, a keyboard 9204, an external connection port 9205, a pointing device 9206, and the like. In this computer, the display portion 9203 includes light-emitting elements similar to those explained in Embodiment Modes 1 to 3, which are arranged in matrix. The light-emitting element has a feature that the lifetime is long. Since the display portion 9203 including the light-emitting element also has the similar feature, this computer has a feature that the lifetime is long. That is, a computer that can withstand long-time use can be provided. Further, since a light-emitting element has high light emission efficiency, a computer having a display portion of which power consumption is reduced can be obtained.

Figure 12C:
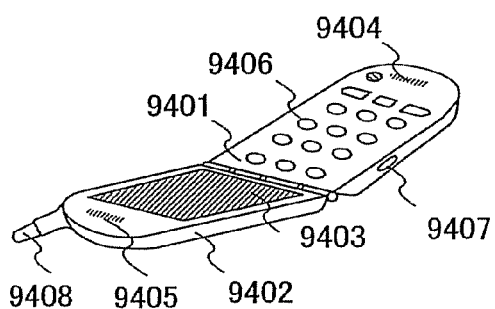

FIG. 12C shows a mobile phone according to the present invention, which includes a main body 9401, a chassis 9402, a display portion 9403, an audio input portion 9404, an audio output portion 9405, an operation key 9406, an external connection port 9407, an antenna 9408, and the like. In this mobile phone, the display portion 9403 includes light-emitting elements similar to those explained in Embodiment Modes 1 to 3, which are arranged in matrix. The light-emitting element has a feature that the lifetime is long. Since the display portion 9403 including the light-emitting element also has the similar feature, this mobile phone has a feature that the lifetime is long. That is, a mobile phone that can withstand long-time use can be provided. Further, since a light-emitting element has high light emission efficiency, a mobile phone having a display portion of which power consumption is reduced can be obtained.

Figure 12D:
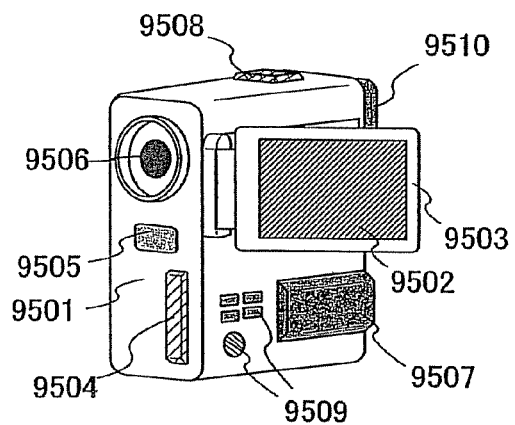

FIG. 12D shows a camera according to the present invention, which includes a main body 9501, a display portion 9502, a chassis 9503, an external connection port 9504, a remote control receiving portion 9505, an image receiving portion 9506, a battery 9507, an audio input portion 9508, an operation key 9509, an eye-piece portion 9510, and the like. In this camera, the display portion 9502 includes light-emitting elements similar to those explained in Embodiment Modes 1 to 3, which are arranged in matrix. The light-emitting element has a feature that the lifetime is long. Since the display portion 9502 including the light-emitting element also has the similar feature, this camera has a feature that the lifetime is long. That is, a camera that can withstand long-time use can be provided. Further, since a light-emitting element has high light emission efficiency, a camera having a display portion of which power consumption is reduced can be obtained.

As described above, the applicable range of the light-emitting device of the present invention is so wide that the light-emitting device can be applied to electronic devices in various fields. By using the light-emitting device of the present invention, an electronic device having a long-lifetime display portion that can withstand long-time use can be provided. Further, an electronic device having a display portion of which power consumption is reduced can be obtained.

Figure 13:
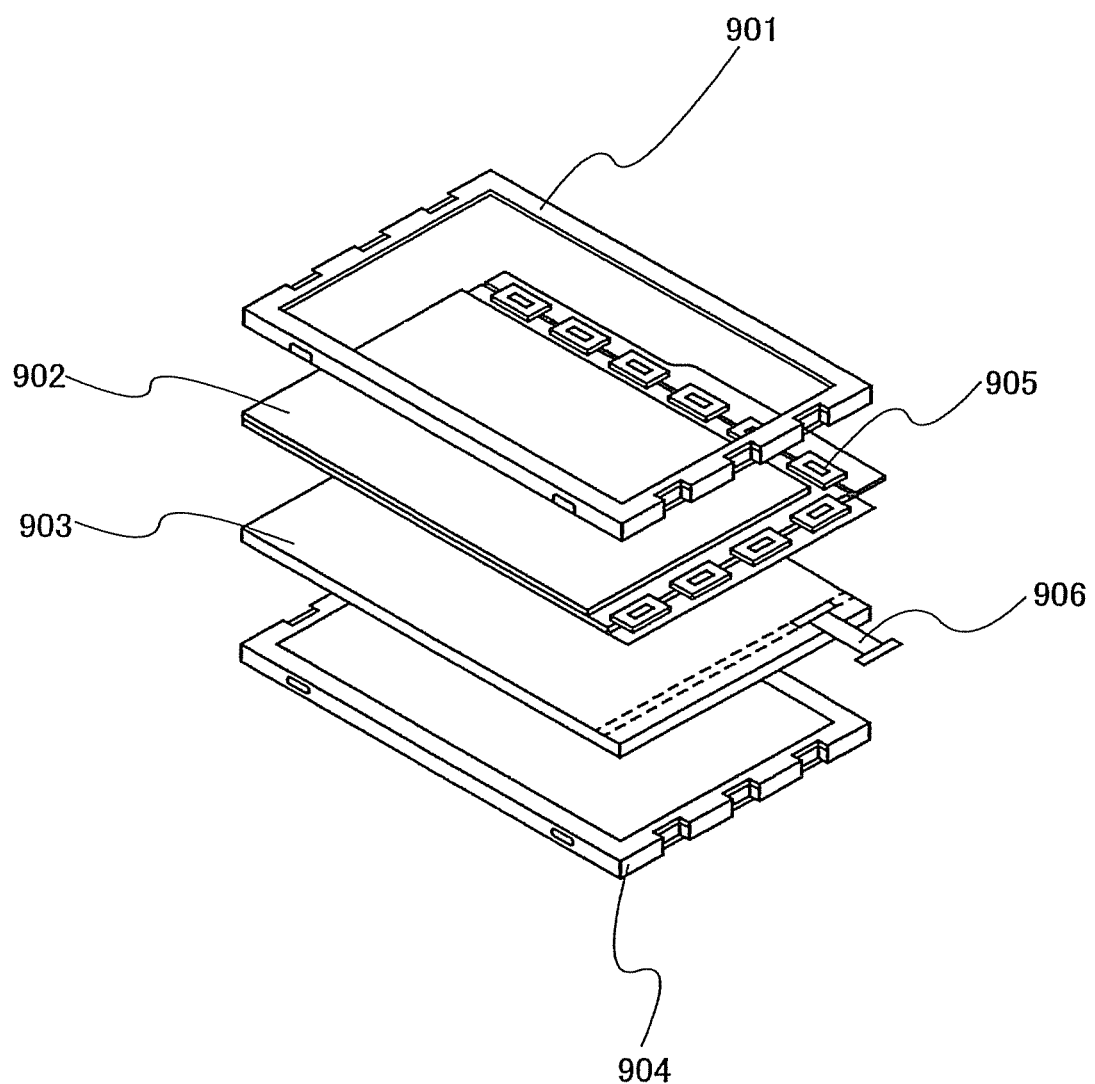
FIG. 13 is a view showing an electronic device in which a light-emitting device of the present invention is used as a backlight.

Alternatively, the light-emitting device of the present invention can also be used as a lightning device. One mode using the light-emitting element of the present invention as a lightning device will be explained with reference to FIG. 13. FIG. 13 shows an example of a liquid crystal display device using the light-emitting device of the present invention as a backlight. The liquid crystal display device shown in FIG. 13 includes a chassis 901, a liquid crystal layer 902, a backlight 903, and a chassis 904, and the liquid crystal layer 902 is connected to a driver IC 905. The light-emitting device of the present invention is used for the backlight 903, and current is supplied through a terminal 906.

By using the light-emitting device of the present invention as the backlight of the liquid crystal display device, a long-lifetime backlight can be obtained. The light-emitting device of the present invention is a lightning device with planar light emission, and can have a large area. Therefore, the backlight can have a large area, and a liquid crystal display device having a large area can be obtained. Furthermore, the light-emitting device of the present invention is thin and consumes low power; therefore, a thin shape and low power consumption of a display device can also be achieved. Furthermore, since the light-emitting element has high light emission efficiency, a light-emitting device that can emit light with high luminance can be obtained. Furthermore, since the light-emitting device of the present invention has a long lifetime, a liquid crystal display device with a long lifetime can be obtained.

Figure 14:
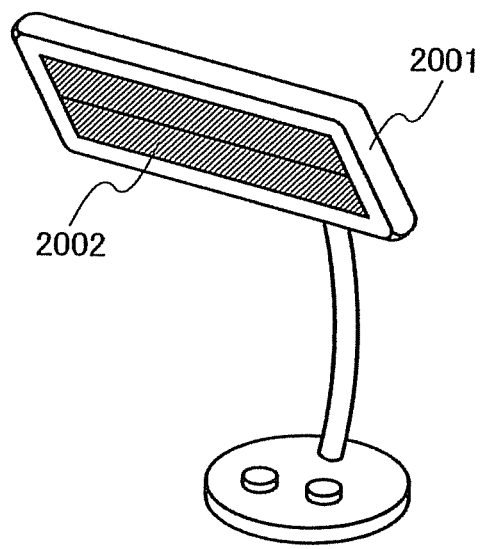
FIG. 14 is a view showing a table lamp as a lightning device of the present invention.

FIG. 14 shows an example of using the light-emitting device, to which the present invention is applied, as a table lamp that is a lighting device. A table lamp shown in FIG. 14 has a chassis 2001 and a light source 2002, and the light-emitting device of the present invention is used as the light source 2002. Since the lifetime of the light-emitting device of the present invention is long, the lifetime of the table lamp is also long.

Figure 15:
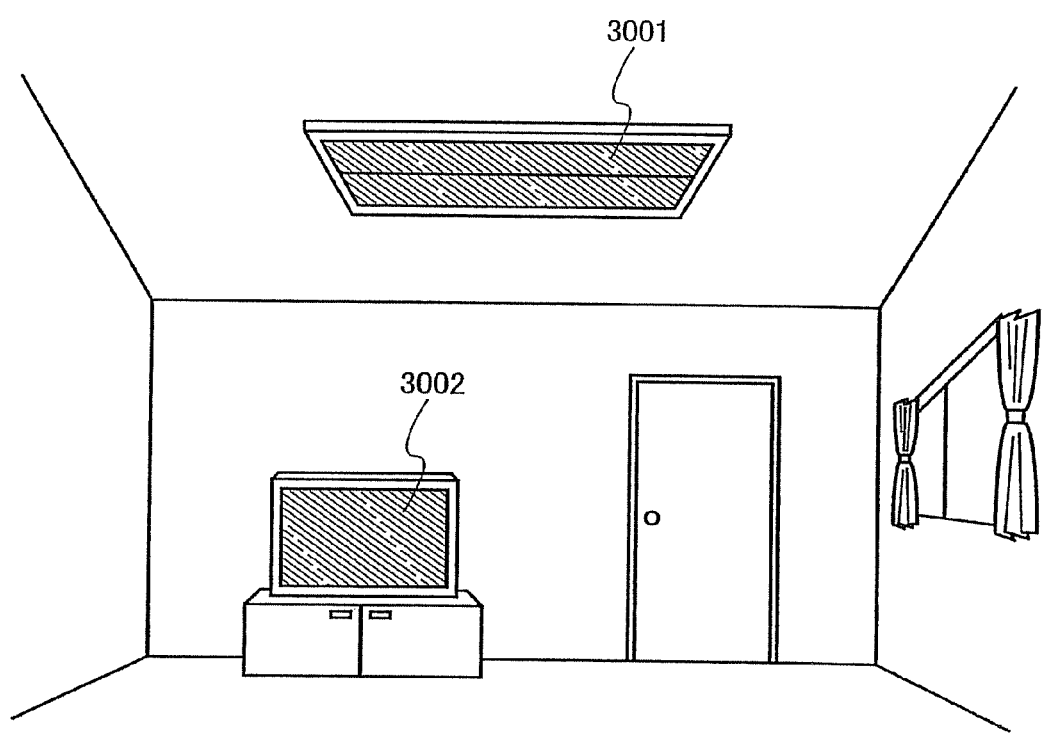
FIG. 15 is a view using an indoor lighting device as a lightning device of the present invention.

FIG. 15 shows an example of using the light-emitting device, to which the present invention is applied, as an indoor lighting device 3001. Since the light-emitting device of the present invention can have a larger area, the light-emitting device of the present invention can be used as a lighting device having a large area. Further, since the lifetime of the light-emitting device of the present invention is long, the light-emitting device of the present invention can be used as a long-lifetime lighting device. A television device 3002 according to the present invention as described in FIG. 12A is placed in a room in which the light-emitting device, to which the present invention is applied, is used as the indoor lighting device 3001. Thus, public broadcasting and movies can be watched. In such a case, since each of the devices has the long lifetime, the number of replacing the lighting device and the television device can be reduced, whereby the environmental load can be reduced.

Embodiment 1

Figure 16:
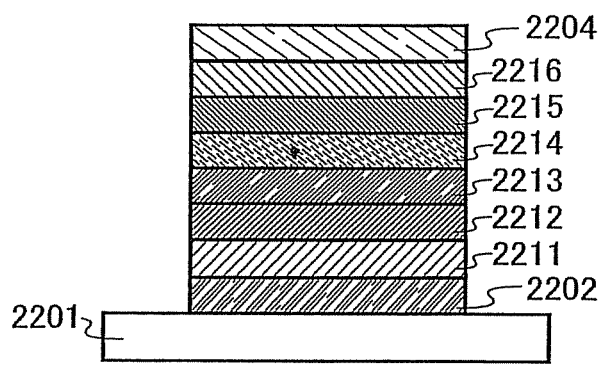
FIG. 16 is a view showing a light-emitting element of an embodiment.

In this embodiment, a light-emitting element of the present invention will be specifically explained with reference to FIG. 16. A structural formula of an organic compound used in Embodiment 1 and Embodiment 2 will be shown below.
[Chemical Formula]
(Manufacture of Light-Emitting Element 1)

First, indium oxide-tin oxide containing silicon oxide was deposited over a glass substrate 2201 by a sputtering method, whereby a first electrode 2202 was formed. Note that the thickness of the first electrode 2202 is 110 nm, and the electrode area is 2 mm×2 mm.

Next, the substrate having the first electrode 2202 was fixed to a substrate holder provided in a vacuum evaporation apparatus in such a way that the surface of the first electrode 2202 faced downward, and then the pressure was reduced to about $10^{-4}$ Pa. Then, 4,4'-bis[N-(1-naphthyl)-N-phenylamino]biphenyl (abbreviation: NPB) and molybdenum(VI) oxide were co-evaporated on the first electrode 2202, whereby a layer 2211 including a composite material was formed. The evaporation rate was controlled so that the thickness of the layer 2211 could be 50 nm and the weight ratio of NPB to molybdenum(VI) oxide could be 4:1 (=NPB:molybdenum oxide). Note that the co-evaporation method is an evaporation method in which evaporation is performed using a plurality of evaporation sources at the same time in one treatment chamber.

Next, a hole transporting layer 2212 was formed by depositing 4,4'-bis[N-(1-naphthyl)-N-phenylamino]biphenyl (abbreviation: NPB) to the thickness of 10 nm by an evaporation method using resistance heating. After that, a light-emitting layer 2213 was formed over the hole transporting layer 2212. The light-emitting layer 2213 was formed by co-evaporating 9-[4-(10-phenyl-9-anthracenyl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the evaporation rate was controlled so that the weight ratio of CzPA to 2PCAPA could be 1:0.05 (=CzPA: 2PCAPA).

Further, a layer 2214 for controlling movement of carriers was formed by co-evaporating tris(8-quinolinolato)aluminum(III) (abbreviation: Alq) and 2PCAPA to a thickness of 10 nm over the light-emitting layer 2213. Here, the evaporation rate was controlled so that the weight ratio of Alq to 2PCAPA could be 1:0.003 (=Alq:2PCAPA). After that, an electron transporting layer 2215 was formed by depositing bathophenanthroline (abbreviation: BPhen) to the thickness of 30 nm over the layer 2214 for controlling movement of carriers by an evaporation method using resistance heating.

Next, an electron injection layer 2216 was formed by depositing lithium fluoride (LiF) to the thickness of 1 nm over the electron transporting layer 2215. Finally, a second electrode 2204 was formed by depositing aluminum to the thickness of 200 nm by an evaporation method using resistance heating. Consequently, a light-emitting element 1 was formed. The light-emitting element 1 of the present invention obtained through the above-described process was put into a glove box containing a nitrogen atmosphere so that the light-emitting element was sealed from atmospheric air.

Figure 17:
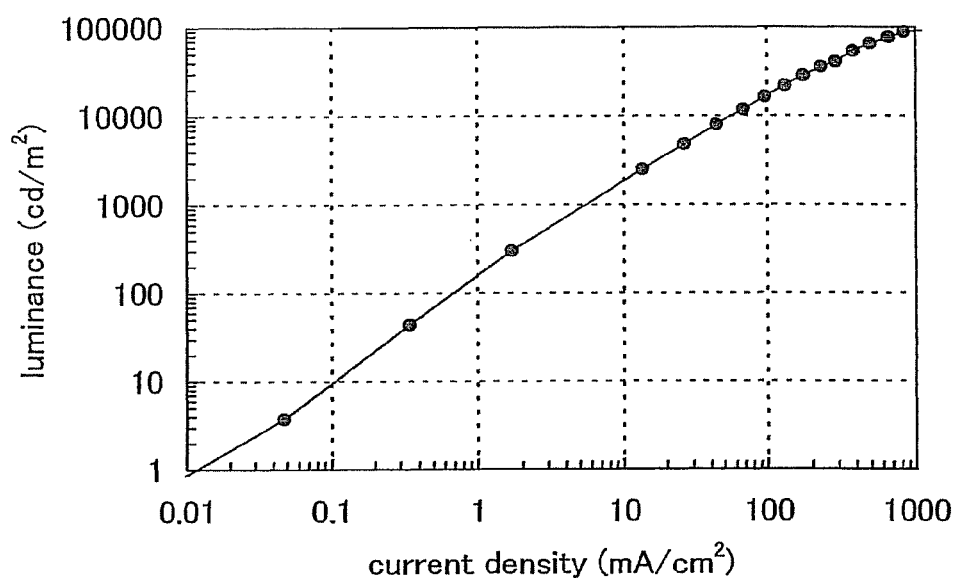
FIG. 17 is a graph showing a current density vs. luminance characteristic of a light-emitting element 1.
Figure 18:
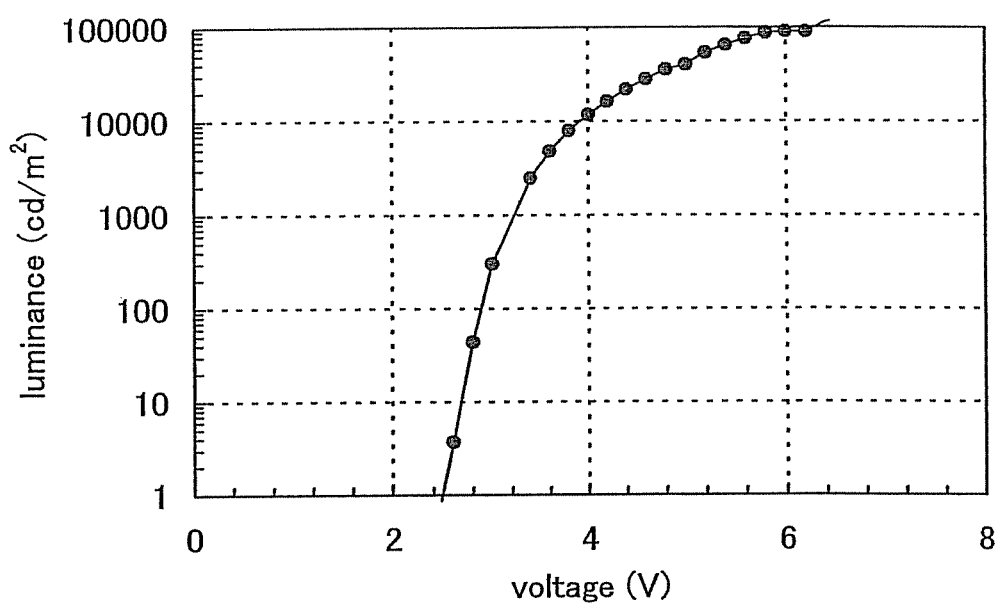
FIG. 18 is a graph showing a voltage vs. luminance characteristic of a light-emitting element 1.
Figure 19:
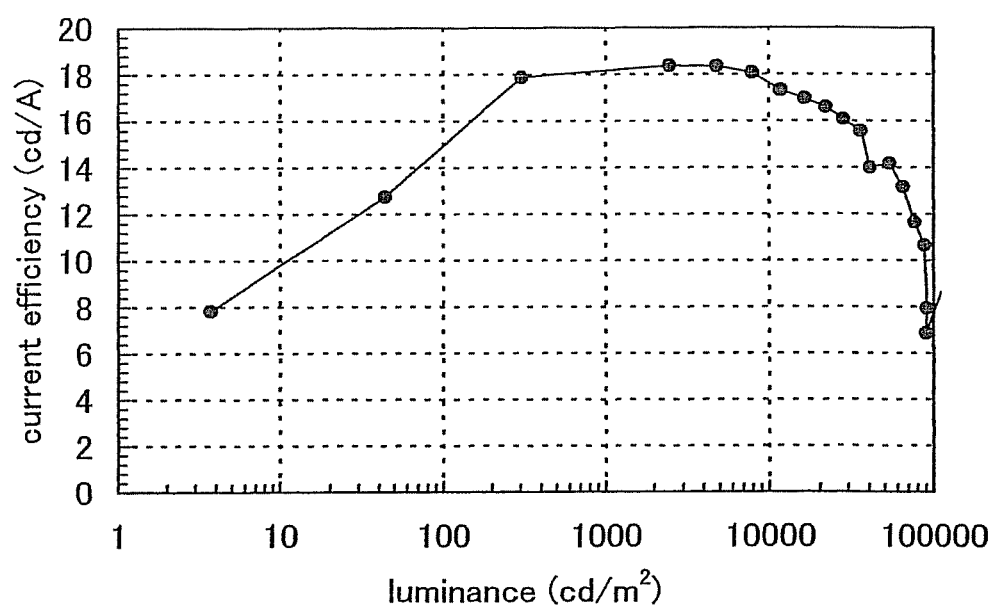
FIG. 19 is a graph showing a luminance vs. current efficiency characteristic of a light-emitting element 1.
Figure 20:
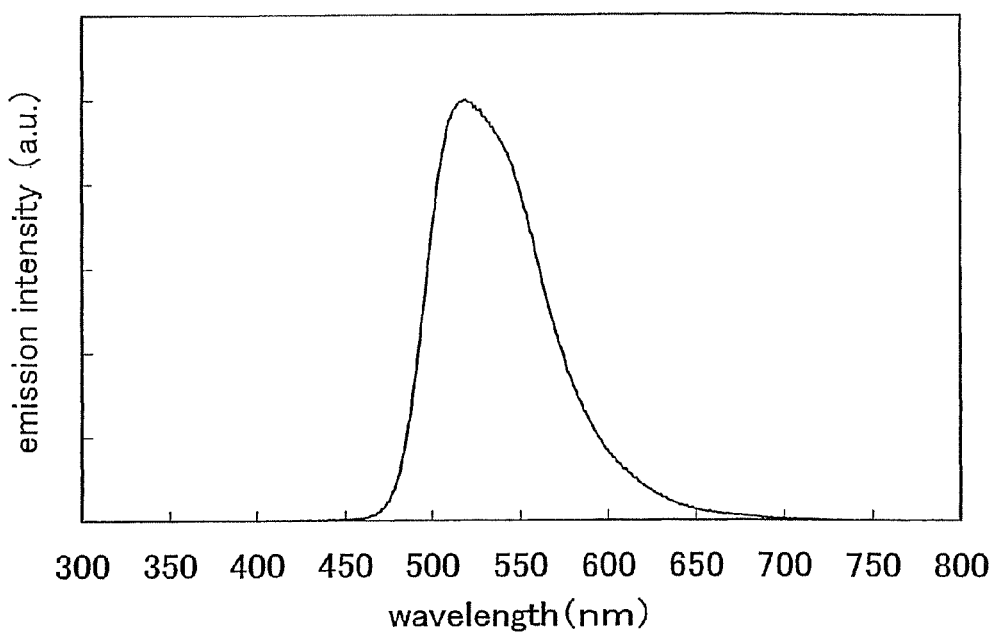
FIG. 20 is a graph showing a light emission spectrum of a light-emitting element 1.
Figure 21:
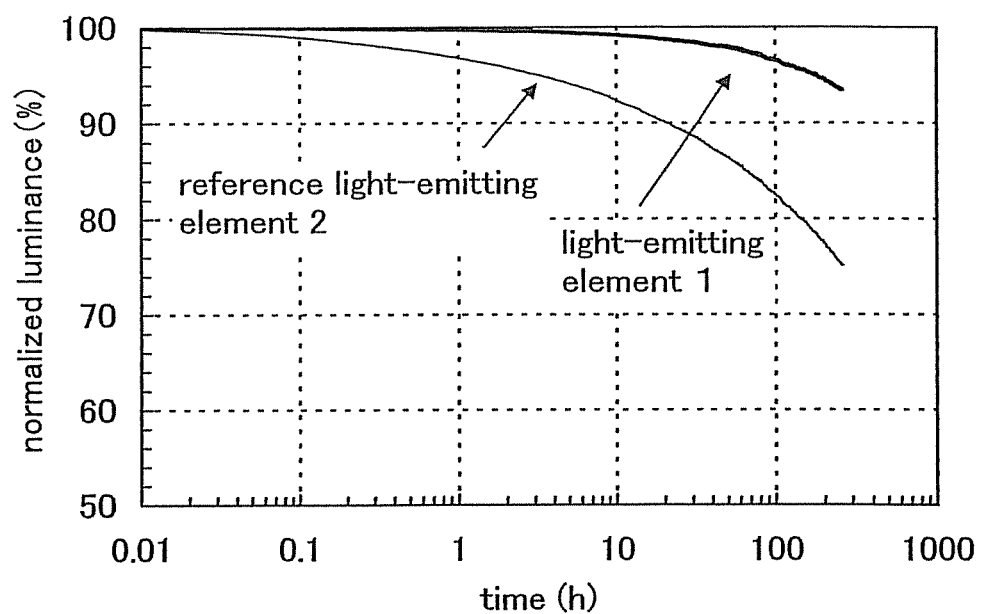
FIG. 21 is a graph showing a result of a continuous lighting test by constant current driving of a light-emitting element 1 and a reference light-emitting element 2.

Then, the operating characteristics of the light-emitting element 1 were measured. Note that the measurement was conducted at a room temperature (atmosphere kept at 25° C.). FIG. 17 shows the current density vs. luminance characteristics of the light-emitting element 1. FIG. 18 shows the voltage vs. luminance characteristics of the light-emitting element 1. FIG. 19 shows the luminance vs. current efficiency characteristics of the light-emitting element 1. FIG. 20 shows the emission spectrum of the light-emitting element 1 with a current supply of 1 mA. FIG. 21 shows the result of the light-emitting element 1, in which a continuous lighting test by constant current driving was conducted with the initial luminance set at 5000 cd/m$^2$ (the vertical axis indicates the relative luminance on the assumption that 5000 cd/m$^2$ is 100%).

The emission color of the light-emitting element 1 was located at the CIE chromaticity coordinates of (x=0.28, y=0.65) at the luminance of 5000 cd/m$^2$, and green emission which derives from 2PCAPA was obtained. In addition, the current efficiency and driving voltage of the light-emitting element 1 at the luminance of 5000 cd/m$^2$ were 18 cd/A and 3.6 V, respectively. Further, when a continuous lighting test of the light-emitting element 1 by constant current driving was conducted with the initial luminance set at 5000 cd/m$^2$, 93% of the initial luminance was maintained even after 260 hours. Thus, it was proved that the light-emitting element 1 has a long lifetime.

(Manufacture of Reference Light-Emitting Element 2)

Next, for the purpose of comparison, a reference light-emitting element 2 without 2PCAPA included in the layer for controlling movement of carriers in the above-described light-emitting element 1 was formed. The manufacturing method will be described below. First, indium oxide-tin oxide containing silicon oxide was deposited over a glass substrate by a sputtering method, whereby a first electrode was formed. Note that the thickness of the first electrode is 110 nm, and the electrode area is 2 mm×2 mm.

Next, the substrate having the first electrode was fixed to a substrate holder provided in a vacuum evaporation apparatus in such a way that the surface of the first electrode faced downward, and then the pressure was reduced to about 10$^{-4}$ Pa. Then, 4,4'-bis[N-(1-naphthyl)-N-phenylamino]biphenyl (abbreviation: NPB) and molybdenum(VI) oxide were co-evaporated on the first electrode, whereby a layer including a composite material was formed. The evaporation rate was controlled so that the thickness of the layer including a composite material could be 50 nm and the weight ratio of NPB to molybdenum(VI) oxide could be 4:1 (=NPB:molybdenum oxide). Note that the co-evaporation method is an evaporation method in which evaporation is performed using a plurality of evaporation sources at the same time in one treatment chamber. Then, a hole transporting layer was formed by depositing 4,4'-bis[N-(1-naphthyl)-N-phenylamino]biphenyl (abbreviation: NPB) to a thickness of 10 nm by an evaporation method using resistance heating.

Next, a light-emitting layer 2213 was formed over the hole transporting layer. The light-emitting layer 2213 was formed by co-evaporating 9-[4-(10-phenyl-9-anthracenyl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the evaporation rate was controlled so that the weight ratio of CzPA to 2PCAPA could be 1:0.05 (=CzPA: 2PCAPA).

Further, tris(8-quinolinolato)aluminum(III) (abbreviation: Alq) was deposited to be a thickness of 30 nm over the light-emitting layer. That is, unlike the light-emitting element 1, a layer without including 2PCAPA, which includes only Alq, was formed. Thereafter, an electron transporting layer was formed by depositing bathophenanthroline (abbreviation: BPhen) to a thickness of 30 nm over the layer including only Alq by an evaporation method using resistance heating.

Then, an electron injection layer was formed by depositing lithium fluoride (LiF) to a thickness of 1 nm over the electron transporting layer. Finally, a second electrode was formed by depositing aluminum to a thickness of 200 inn by an evaporation method using resistance heating. Consequently, the reference light-emitting element 2 was formed. The reference light-emitting element 2 obtained through the above-described process was put into a glove box containing a nitrogen atmosphere so that the light-emitting element was sealed from atmospheric air.

Thereafter, the operating characteristics of the reference light-emitting element 2 were measured. Note that the measurement was conducted at a room temperature (atmosphere kept at 25° C.). The emission color of the reference light-emitting element 2 was located at the CIE chromaticity coordinates of (x=0.29, y=0.64) at the luminance of 5000 cd/m$^2$; the current efficiency of the reference light-emitting element 2 was 18 cd/A; and it exhibited green emission which derives from 2PCAPA similarly to the light-emitting element 1. However, when a continuous lighting test was conducted with the initial luminance set at 5000 cd/m², luminance has decreased to 75% of the initial luminance after 260 hours as shown in FIG. 21. Thus, it was found that the reference light-emitting element 2 has a shorter lifetime than the light-emitting element 1. Therefore, it was proved that a long-lifetime light-emitting element can be obtained by applying the present invention.

Embodiment 2

In this embodiment, a light-emitting element of the present invention will be specifically explained with reference to FIG. 16.

(Manufacture of Light-Emitting Element)

First, indium oxide-tin oxide containing silicon oxide was deposited over a glass substrate 2201 by a sputtering method, whereby a first electrode 2202 was formed. Note that the thickness of the first electrode 2202 is 110 nm, and the electrode area is 2 mm×2 mm.

Next, the substrate having the first electrode 2202 was fixed to a substrate holder provided in a vacuum evaporation apparatus in such a way that the surface of the first electrode 2202 faced downward, and then the pressure was reduced to about $10^{-4}$ Pa. Then, 4,4'-bis[N-(1-naphthyl)-N-phenylamino]biphenyl (abbreviation: NPB) and molybdenum(VI) oxide were co-evaporated on the first electrode 2202, whereby a layer 2211 including a composite material was formed. The evaporation rate was controlled so that the thickness of the layer 2211 could be 50 nm and the weight ratio of NPB to molybdenum(VI) oxide could be 4:1 (=NPB:molybdenum oxide). Note that the co-evaporation method is an evaporation method in which evaporation is performed using a plurality of evaporation sources at the same time in one treatment chamber.

Next, a hole transporting layer 2212 was formed by depositing 4,4'-bis[N-(1-naphthyl)-N-phenylamino]biphenyl (abbreviation: NPB) to a thickness of 10 nm by an evaporation method using resistance heating. Subsequently, a light-emitting layer 2213 was formed over the hole transporting layer 2212. The light-emitting layer 2213 was formed by co-evaporating 9-[4-(10-phenyl-9-anthracenyl)phenyl]-9H-carbazole (abbreviation: CzPA) and N-(9,10-diphenyl-2-anthryl)-N,9-diphenyl-9H-carbazol-3-amine (abbreviation: 2PCAPA) to a thickness of 30 nm. Here, the evaporation rate was controlled so that the weight ratio of CzPA to 2PCAPA could be 1:0.05 (=CzPA: 2PCAPA).

Further, a layer 2214 for controlling movement of carriers was formed by co-evaporating tris(8-quinolinolato)aluminum(III) (abbreviation: Alq) and Coumarinne 30 to a thickness of 10 nm over the light-emitting layer 2213. Here, the evaporation rate was controlled so that the weight ratio of Alq to Coumarin 30 could be 1:0.005 (=Alq:Coumarin 30). After that, an electron transporting layer 2215 was formed by depositing bathophenanthroline (abbreviation: BPhen) to a thickness of 30 nm over the layer 2214 for controlling movement of carriers by an evaporation method using resistance heating.

Then, an electron injection layer 2216 was formed by depositing lithium fluoride (LiF) to a thickness of 1 nm over the electron transporting layer 2215. Finally, a second electrode 2204 was formed by depositing aluminum to a thickness of 200 nm by an evaporation method using resistance heating. Consequently, a light-emitting element 3 was formed. The light-emitting element 3 of the present invention obtained through the above-described process was put into a glove box containing a nitrogen atmosphere so that the light-emitting element was sealed from atmospheric air. Then, the operating characteristics of the light-emitting element 3 were measured. Note that the measurement was conducted at a room temperature (atmosphere kept at 25° C.).

Figure 22:
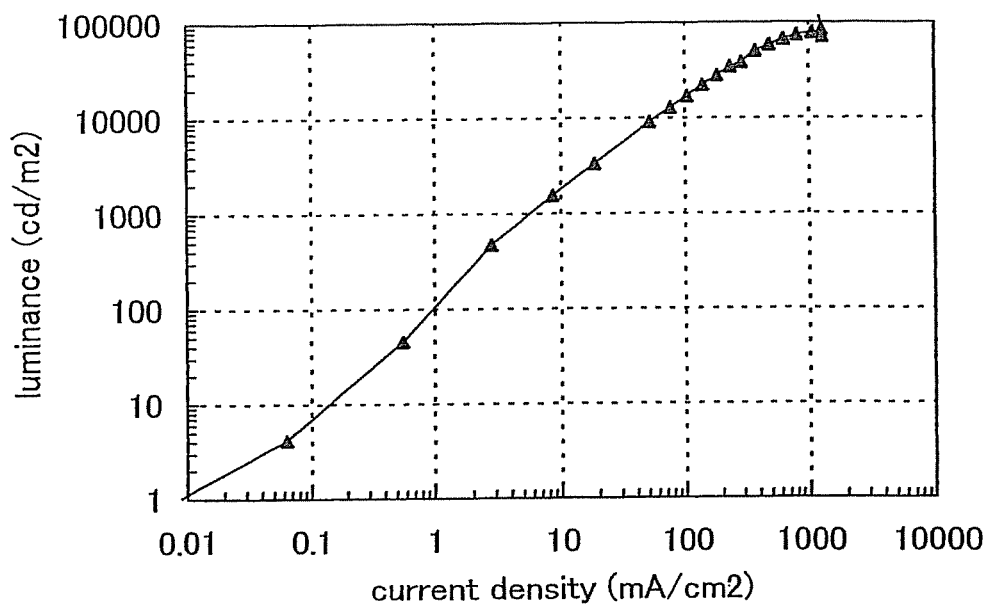
FIG. 22 is a graph showing a current density vs. luminance characteristic of a light-emitting element 3.
Figure 23:
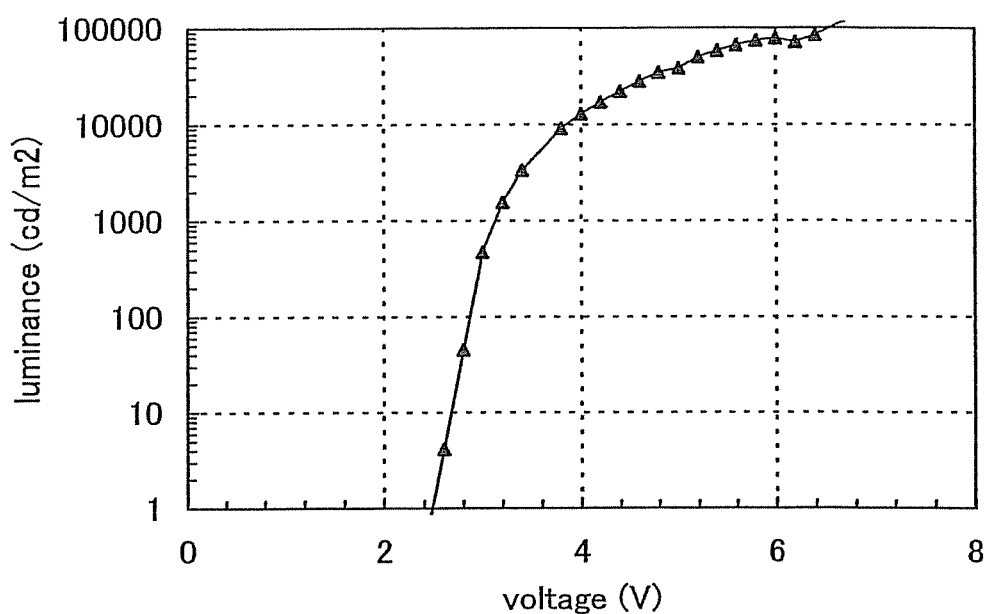
FIG. 23 is a graph showing a voltage vs. luminance characteristic of a light-emitting element 3.
Figure 24:
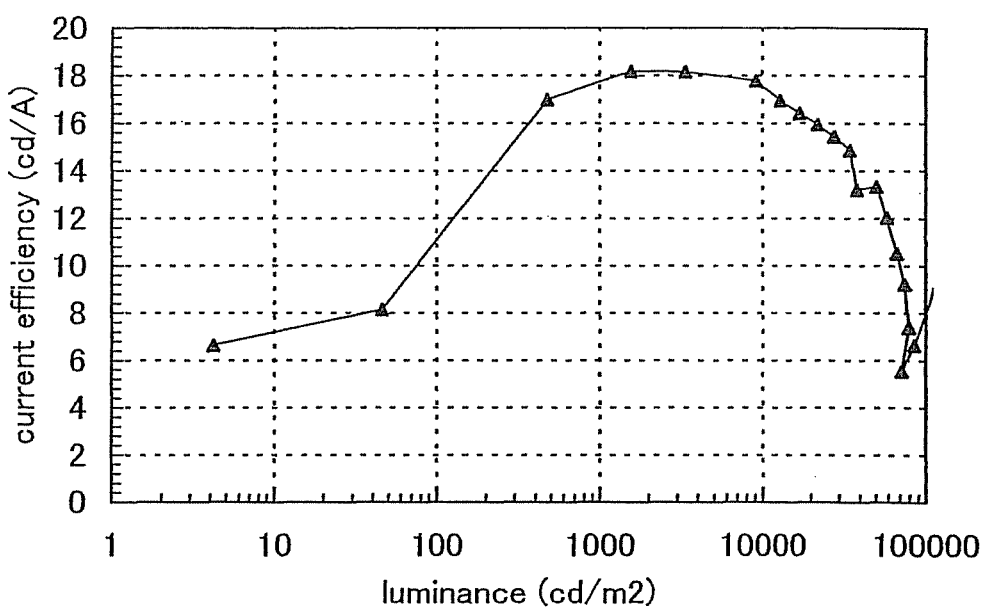
FIG. 24 is a graph showing a luminance-current efficiency characteristic of a light-emitting element 3.
Figure 25:
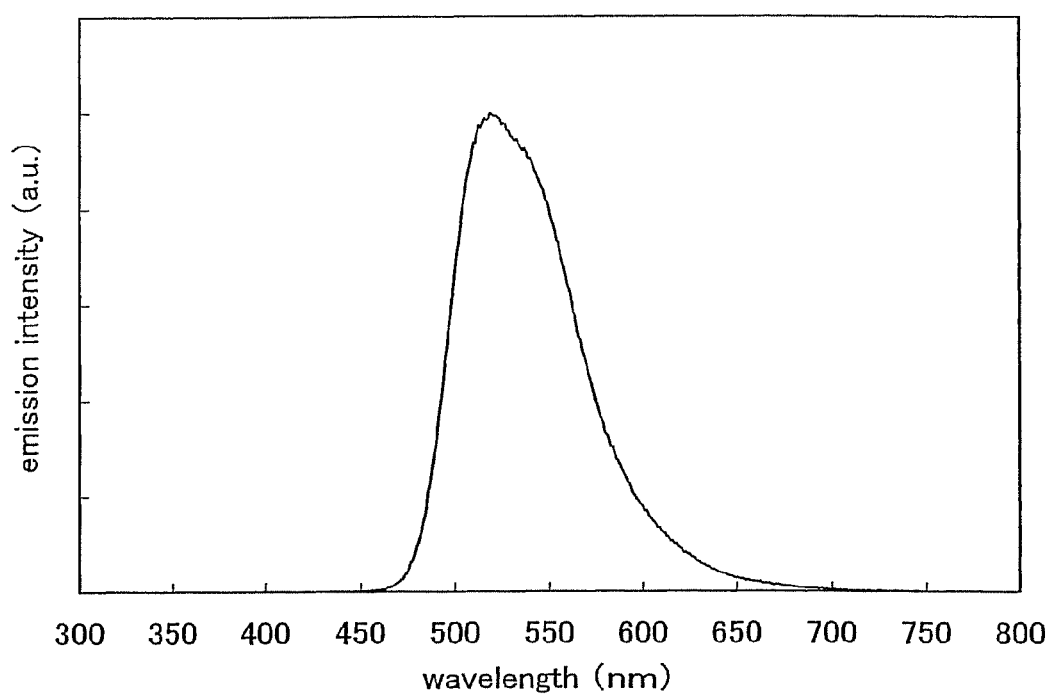
FIG. 25 is a graph showing a light emission spectrum of a light-emitting element 3.

FIG. 22 shows the current density vs. luminance characteristics of the light-emitting element 3. FIG. 23 shows the voltage vs. luminance characteristics of the light-emitting element 3. FIG. 24 shows the luminance vs. current efficiency characteristics of the light-emitting element 3. FIG. 25 shows the emission spectrum of the light-emitting element 3 with a current supply of 1 mA. The emission color of the light-emitting element 3 was located at the CIE chromaticity coordinates of (x=0.28, y=0.65) at the luminance of 5000 cd/m², and green emission which derives from 2PCAPA was obtained. In addition, the current efficiency and driving voltage of the light-emitting element 3 at the luminance of 5000 cd/m² were 18 cd/A and 3.5 V, respectively.

Characteristics Measurement Example

In this embodiment, reduction reaction characteristics of tris(8-quinolinolato)aluminum(III) (abbreviation: Alq), N-(9,10-diphenyl-2-anthryl)-N,9-diphenyl-9H-carbazol-3-amine (abbreviation: 2PCAPA), and Coumarin 30, which are used for the layer for controlling movement of carriers in the light-emitting elements 1 and 2 manufactured in Embodiments 1 and 2, were observed by cyclic voltammetry (CV) measurement. Further, the LUMO levels of Alq, 2PCAPA, and Coumarin 30 were determined from the measurement results. Note that an electrochemical analyzer (ALS model 600A or 600C, manufactured by BAS Inc.) was used for the measurement.

As for a solution used in the CV measurement, dehydrated dimethylformamide (DMF, manufactured by Sigma-Aldrich Inc., 99.8%, catalog No. 22705-6) was used for a solvent, and tetra-n-butylammonium perchlorate (n-Bu$_4$NClO$_4$, manufactured by Tokyo Chemical Industry Co., Ltd., catalog No. T0836), which is a supporting electrolyte, was dissolved in the solvent such that the concentration of tetra-n-butylammonium perchlorate was 100 mmol/L. Further, the object to be measured was also dissolved in the solvent such that the concentration thereof was 1 mmol/L. In addition, a platinum electrode (a PIE platinum electrode, product of BAS Inc.) was used as a working electrode; a platinum electrode (a VC-3 Pt counter electrode (5 cm), manufactured by BAS Inc.) was used as an auxiliary electrode; and an Ag/Ag$^+$ electrode (an RE5 nonaqueous solvent reference electrode, manufactured by BAS Inc.) was used as a reference electrode. Note that the measurement was conducted at a room temperature (20 to 25° C.).

(Calculation of the Potential Energy of the Reference Electrode with Respect to the Vacuum Level)

First, potential energy (eV) of the reference electrode (Ag/Ag$^+$ electrode) used in Embodiment 2 with respect to the vacuum level was calculated. That is, the Fermi level of the Ag/Ag$^+$ electrode was calculated. It is known that the oxidation-reduction potential of ferrocene in methanol is +0.610 V [vs. SHE] with respect to a standard hydrogen electrode (Reference: Christian R. Goldsmith et al., J. Am. Chem. Soc., Vol. 124, No. 1, pp. 83-96, 2002). On the other hand, when the oxidation-reduction potential of ferrocene in methanol was calculated using the reference electrode used in Embodiment 2, the result was +0.20 V [vs. Ag/Ag$^+$]. Therefore, it was found that the potential energy of the reference electrode used in Embodiment 2 was lower than that of the standard hydrogen electrode by 0.41 [eV].

Here, it is also known that the potential energy of the standard hydrogen electrode with respect to the vacuum level is −4.44 eV (Reference: Toshihiro Ohnishi and Tamami Koyama, High molecular EL material, Kyoritsu shuppan, pp. 64-67). Accordingly, the potential energy of the reference electrode used in Embodiment 2 with respect to the vacuum level could be determined to be −4.44−0.41=−4.85 [eV].

Measurement Example 1

Alq

Figure 26:
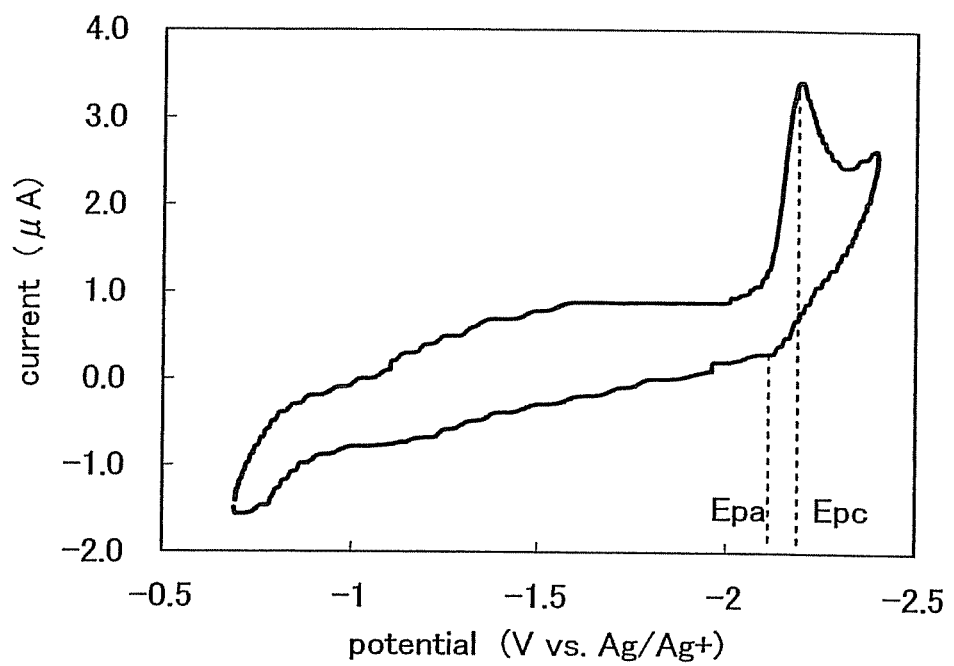
FIG. 26 is a graph showing a reductive reaction characteristic of Alq.

In Measurement Example 1, the reduction reaction characteristics of Alq were observed by cyclic voltammetry (CV) measurement. The scan rate was set at 0.1 V/sec. FIG. 26 shows the measurement result. Note that the measurement of the reduction reaction characteristics was conducted by the steps of: scanning the potential of the working electrode with respect to the reference electrode in ranges of (1) −0.69 V to −2.40 V, and then (2) −2.40 V to −0.69 V.

As shown in FIG. 26, it can be seen that a reduction peak potential $E_{pc}$ is −2.20 V and an oxidation peak potential $E_{pa}$ is −2.12 V. Therefore, half-wave potential (an intermediate potential between $E_{pc}$ and $E_{pa}$) can be determined to be −2.16 V. This shows that Alq can be reduced by an electrical energy of −2.16 V [vs. Ag/Ag$^+$], and this energy corresponds to the LUMO level. Here, the potential energy of the reference electrode used in this measurement example with respect to the vacuum level is −4.85 [eV] as described above. Therefore, the LUMO level of Alq can be determined to be −4.85−(−2.16)=−2.69 [eV].

Measurement Example 2

2PCAPA

Figure 27:
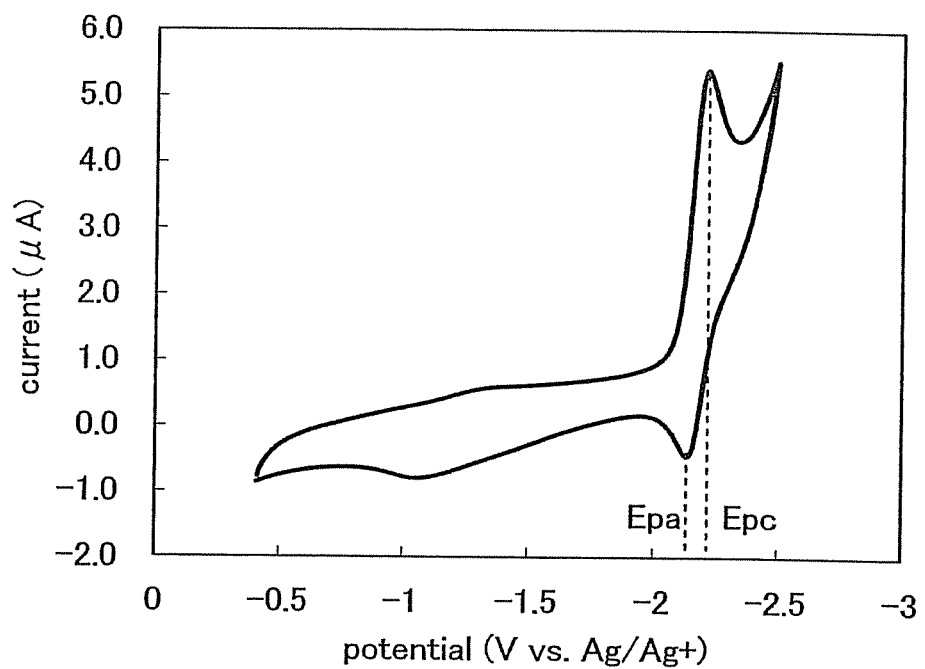
FIG. 27 is a graph showing a reductive reaction characteristic of 2PCAPA.

In Measurement Example 2, the reduction reaction characteristics of 2PCAPA were observed by cyclic voltammetry (CV) measurement. The scan rate was set at 0.1 V/sec. FIG. 27 shows the measurement result. Note that the measurement of the reduction reaction characteristics was conducted by the steps of: scanning the potential of the working electrode with respect to the reference electrode in ranges of (1) −0.41 V to −2.50 V, and then (2) −2.50 V to −0.41 V. As shown in FIG. 27, it can be seen that a reduction peak potential $E_{pc}$ is −2.21 V and an oxidation peak potential $E_{pa}$ is −2.14 V.

Therefore, half-wave potential (an intermediate potential between $E_{pc}$ and $E_{pa}$) can be determined to be −2.18 V. This shows that 2PCAPA can be reduced by an electrical energy of −2.18 V [vs. Ag/Ag$^+$], and this energy corresponds to the LUMO level. Here, the potential energy of the reference electrode used in this measurement example with respect to the vacuum level is −4.85 [eV] as described above. Therefore, the LUMO level of 2PCAPA can be determined to be −4.85−(−2.18)=−2.67 [eV]. Note that when the LUMO levels of Alq and 2PCAPA which were calculated in the above-described manner are compared, it can be found that the LUMO level of 2PCAPA is lower than that of Alq by as much as 0.02 [eV]. Therefore, it is quite advantageous to use Alq and 2PCAPA for the layer for controlling movement of carriers.

Measurement Example 3

Coumarin 30

Figure 28:
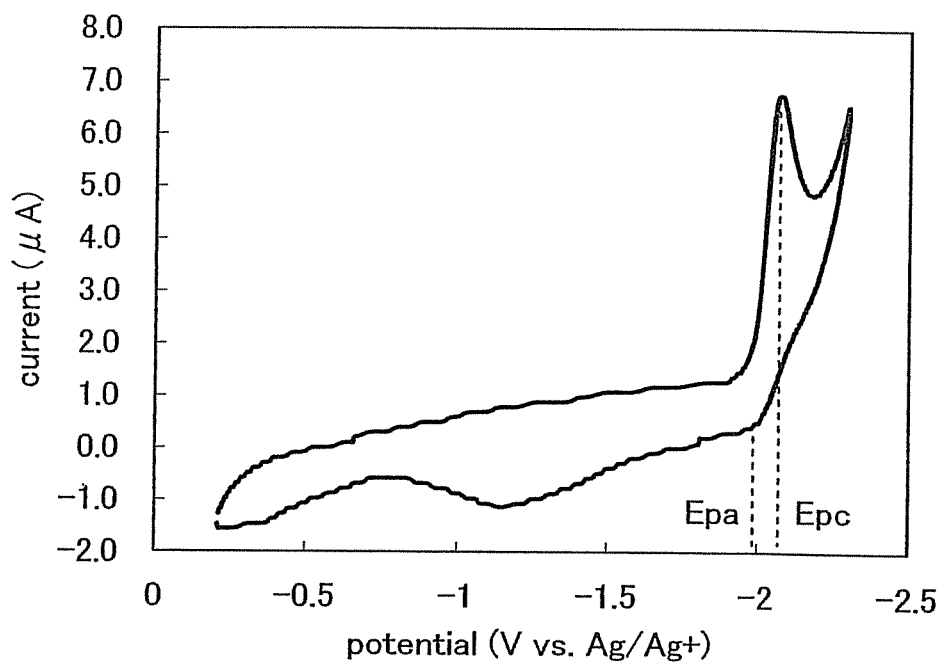
FIG. 28 is a graph showing a reductive reaction of Coumarin 30.

In Measurement Example 3, the reduction reaction characteristics of Coumarin 30 were observed by cyclic voltammetry (CV) measurement. The scan rate was set at 0.1 V/sec. FIG. 28 shows the measurement result. Note that the measurement of the reduction reaction characteristics was conducted by the steps of: scanning the potential of the working electrode with respect to the reference electrode in ranges of (1) −0.21 V to −2.30 V, and then (2) −2.30 V to −0.21 V. As shown in FIG. 28, it can be seen that a reduction peak potential $E_{pc}$ is −2.07 V and an oxidation peak potential $E_{pa}$ is −1.99 V.

Therefore, half-wave potential (an intermediate potential between $E_{pc}$ and $E_{pa}$) can be determined to be −2.03 V. This shows that Coumarin 30 can be reduced by an electrical energy of −2.03 V [vs. Ag/Ag$^+$], and this energy corresponds to the LUMO level. Here, the potential energy of the reference electrode used in this measurement example with respect to the vacuum level is −4.85 [eV] as described above. Therefore, the LUMO level of Coumarin 30 can be determined to be −4.85−(−2.03)=−2.82 [eV]. Note that when the LUMO levels of Alq and Coumarin 30 which were calculated in the above-described manner are compared, it can be found that the LUMO level of Coumarin 30 is lower than that of Alq by as much as 0.13 [eV]. Therefore, it is quite advantageous to use Alq and Coumarin 30 for the layer for controlling movement of carriers.

This application is based on Japanese Patent Application serial no. 2006-184350 filed in Japan Patent Office on Jul. 4, 2006 and Japanese Patent Application serial no. 2006-327609 filed in Japan Patent Office on Dec. 4, 2006, the entire contents of which are hereby incorporated by reference.

What is claimed is:

1. A light-emitting element comprising:
a first electrode;
a second electrode;
a light-emitting layer between the first electrode and the second electrode, the light-emitting layer comprising a first substance having a light-emitting property;
a first layer between the second electrode and the light-emitting layer, the first layer comprising:
a second substance having a carrier transporting property; and
a third substance for reducing the carrier transporting property of the second substance; and
a second layer between the second electrode and the first layer, the second layer comprising a fourth substance having a carrier transporting property,
wherein the second substance is different from the fourth substance.

2. A light-emitting element according to claim 1, wherein a difference between a wavelength of the highest peak of an emission spectrum of the third substance and a wavelength of the highest peak of an emission spectrum of the first substance is within 30 nm.

3. A light-emitting element according to claim 1, wherein an emission color of the third substance and an emission color of the first substance are similar colors.

4. A light-emitting element according to claim 1, wherein the first layer is in contact with the light-emitting layer.

5. A light-emitting element according to claim 1, wherein a thickness of the first layer is greater than or equal to 5 nm and less than or equal to 20 nm.

6. A light-emitting element according to claim 1, wherein a proportion of weight of the second substance is greater than a proportion of weight of the third substance in the first layer.

7. A light-emitting element according to claim 1,
wherein the carrier is an electron, and
wherein a difference between a lowest unoccupied molecular orbital level of the second substance and a lowest unoccupied molecular orbital level of the third substance is less than 0.3 eV.

8. A light-emitting element according to claim 1,
wherein the carrier is an electron,
wherein the second substance is a metal complex, and
wherein the third substance is an aromatic amine compound.

9. A light-emitting element according to claim 1,
wherein the carrier is a hole, and
wherein a difference between a highest occupied molecular orbital level of the second substance and a highest occupied molecular orbital level of the third substance is less than 0.3 eV.

10. A light-emitting element according to claim 1,
wherein the carrier is a hole,
wherein the second substance is an aromatic amine compound, and
wherein the third substance is a metal complex.

11. A light-emitting element according to claim 1,
wherein the light-emitting layer further comprises a fifth substance having a carrier transporting property, and
wherein a proportion of weight of the fifth substance is greater than a proportion of weight of the first substance in the light-emitting layer.

12. A light-emitting element according to claim 11,
wherein structures of the second substance and the fifth substance are different from each other.

13. A light-emitting element according to claim 1, further comprising a third layer between the first layer and the light-emitting layer, the third layer comprising a fifth substance having a carrier transporting property.

14. A light-emitting element according to claim 13,
wherein the third layer is in contact with the light-emitting layer and the first layer.

15. A light-emitting element according to claim 1, further comprising a third layer between the first electrode and the light-emitting layer, the third layer comprising:
a fifth substance having a carrier transporting property; and
a sixth substance for reducing the carrier transporting property of the fifth substance,
wherein a proportion of weight of the fifth substance is greater than a proportion of weight of the sixth' substance in the third layer.

16. A light-emitting device comprising the light-emitting element according to claim 1.

17. An electronic device comprising a display portion comprising the light-emitting element according to claim 1.

18. A lighting device comprising the light-emitting element according to claim 1.

19. A light-emitting element comprising:
an anode;
a cathode;
a light-emitting layer between the anode and the cathode, the light-emitting layer comprising a first substance having a light-emitting property;
a first layer between the cathode and the light-emitting layer, the first layer comprising:
a second substance having an electron transporting property; and
a third substance having a hole transporting property; and
a second layer between the cathode and the first layer, the second layer comprising a fourth substance having an electron transporting property,
wherein the second substance is different from the fourth substance.

20. A light-emitting element according to claim 19,
wherein a difference between a wavelength of the highest peak of an emission spectrum of the third substance and a wavelength of the highest peak of an emission spectrum of the first substance is within 30 nm.

21. A light-emitting element according to claim 19,
wherein an emission color of the third substance and an emission color of the first substance are similar colors.

22. A light-emitting element according to claim 19,
wherein the first layer is in contact with the light-emitting layer.

23. A light-emitting element according to claim 19,
wherein a thickness of the first layer is greater than or equal to 5 nm and less than or equal to 20 nm.

24. A light-emitting element according to claim 19,
wherein a proportion of weight of the second substance is greater than a proportion of weight of the third substance in the first layer.

25. A light-emitting element according to claim 24,
wherein a difference between a lowest unoccupied molecular orbital level of the second substance and a lowest unoccupied molecular orbital level of the third substance is less than 0.3 eV.

26. A light-emitting element according to claim 24,
wherein the second substance is a metal complex, and
wherein the third substance is an aromatic amine compound.

27. A light-emitting element according to claim 24,
wherein the light-emitting layer has an electron transporting property.

28. A light-emitting element according to claim 24,
wherein, when a magnitude of a dipole moment of the second substance is $P_1$ and a magnitude of a dipole moment of the third substance is $P_2$, $P_1/P_2 \geq 3$ is satisfied.

29. A light-emitting element according to claim 24,
wherein the light-emitting layer further comprises a fifth substance having an electron transporting property, and
wherein a proportion of weight of the fifth substance is greater than a proportion of weight of the first substance in the light-emitting layer.

30. A light-emitting element according to claim 29,
wherein structures of the second substance and the fifth substance are different from each other.

31. A light-emitting element according to claim 19, further comprising a third layer between the first layer and the light-emitting layer, the third layer comprising a fifth substance having an electron transporting property.

32. A light-emitting element according to claim 31,
wherein the third layer is in contact with the light-emitting layer and the first layer.

33. A light-emitting element according to claim 19, further comprising a third layer between the anode and the light-emitting layer, the third layer comprising:
a fifth substance having a hole transporting property; and
a sixth substance having an electron transporting property,
wherein a proportion of weight of the fifth substance is greater than a proportion of weight of the sixth substance in the third layer.

34. A light-emitting device comprising the light-emitting element according to claim 19.

35. An electronic device comprising a display portion comprising the light-emitting element according to claim 19.

36. A lighting device comprising the light-emitting element according to claim 19.

37. A light-emitting element comprising:
an anode;
a cathode;
a light-emitting layer between the cathode and the anode, the light-emitting layer comprising a first substance having a light-emitting property;
a first layer between the anode and the light-emitting layer, the first layer comprising:
   a second substance having a hole transporting property; and
   a third substance having an electron transporting property; and
a second layer between the anode and the first layer, the second layer comprising a fourth substance having a hole transporting property,
wherein the second substance is different from the fourth substance.

38. A light-emitting element according to claim 37, wherein a difference between a wavelength of the highest peak of an emission spectrum of the third substance and a wavelength of the highest peak of an emission spectrum of the first substance is within 30 nm.

39. A light-emitting element according to claim 37, wherein an emission color of the third substance and an emission color of the first substance are similar colors.

40. A light-emitting element according to claim 37, wherein the first layer is in contact with the light-emitting layer.

41. A light-emitting element according to claim 37, wherein a thickness of the first layer is greater than or equal to 5 um and less than or equal to 20 nm.

42. A light-emitting element according to claim 37, wherein a proportion of weight of the second substance is greater than a proportion of weight of the third substance in the first layer.

43. A light-emitting element according to claim 42, wherein a difference between a highest occupied molecular orbital level of the second substance and a highest occupied molecular orbital level of the third substance is less than 0.3 eV.

44. A light-emitting element according to claim 42,
wherein the second substance is an aromatic amine compound, and
wherein the third substance is a metal complex.

45. A light-emitting element according to claim 42,
wherein the light-emitting layer has a hole transporting property.

46. A light-emitting element according to claim 42,
wherein, when a magnitude of a dipole moment of the second substance is $P_1$ and a magnitude of a dipole moment of the third substance is $P_2$, $P_1/P_2 \leq 0.33$ is satisfied.

47. A light-emitting element according to claim 42,
wherein the light-emitting layer further comprises a fifth substance having a hole transporting property, and
wherein a proportion of weight of the fifth substance is greater than a proportion of weight of the first substance in the light-emitting layer.

48. A light-emitting element according to claim 47,
wherein structures of the second substance and the fifth substance are different from each other.

49. A light-emitting element according to claim 37, further comprising a third layer between the first layer and the light-emitting layer, the third layer comprising a fifth substance having a hole transporting property.

50. A light-emitting element according to claim 49,
wherein the third layer is in contact with the light-emitting layer and the first layer.

51. A light-emitting element according to claim 37, further comprising a third layer between the cathode and the light-emitting layer, the third layer comprising:
a fifth substance having an electron transporting property; and
a sixth substance having a hole transporting property,
wherein a proportion of weight of the fifth substance is greater than a proportion of weight of the sixth substance in the third layer.

52. A light-emitting device comprising the light-emitting element according to claim 37.

53. An electronic device comprising a display portion comprising the light-emitting element according to claim 37.

54. A lighting, device comprising the light-emitting element according to claim 37.

* * * * *

UNITED STATES PATENT AND TRADEMARK OFFICE
CERTIFICATE OF CORRECTION

| | | |
|---|---|---|
| PATENT NO. | : 8,587,193 B2 | Page 1 of 1 |
| APPLICATION NO. | : 13/680228 | |
| DATED | : November 19, 2013 | |
| INVENTOR(S) | : Tsunenori Suzuki et al. | |

It is certified that error appears in the above-identified patent and that said Letters Patent is hereby corrected as shown below:

In the Specification:

Column 12, line 29; Change "elections" to --electrons--.
Column 12, line 44; Change "Since, the" to --Since the--.
Column 18, line 57; Change "faulted" to --formed--.
Column 20, line 56; Change "(Iii)" to --(TFT)--.
Column 20, line 66; Change "P-channel TFT." to --P-channel TFTs.--.
Column 24, line 60; Change "), DFLDPBi," to --), TPD, DFLDPBi,--.
Column 30, line 58; Change "may have, either" to --may have either--.
Column 38, line 51; Change "200 inn by" to --200 nm by--.
Column 40, line 42; Change "(a PIE" to --( a PTE--.

In the Claims:

Column 45, line 34, Claim 41; Change "5 um" to --5 nm--.
Column 46, line 41, Claim 54; Change "A lighting, device" to --A lighting device--.

Signed and Sealed this
Twenty-second Day of April, 2014

Michelle K. Lee
*Deputy Director of the United States Patent and Trademark Office*